United States Patent
Nagashima et al.

(10) Patent No.: US 10,897,808 B2
(45) Date of Patent: Jan. 19, 2021

(54) FILTER DEVICE AND PLASMA PROCESSING APPARATUS

(71) Applicant: TOKYO ELECTRON LIMITED, Tokyo (JP)

(72) Inventors: Nozomu Nagashima, Miyagi (JP); Naohiko Okunishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 385 days.

(21) Appl. No.: 15/803,070

(22) Filed: Nov. 3, 2017

(65) Prior Publication Data

US 2018/0139834 A1 May 17, 2018

(30) Foreign Application Priority Data

Nov. 11, 2016 (JP) .................... 2016-220641

(51) Int. Cl.
| | |
|---|---|
| B23K 10/00 | (2006.01) |
| H05H 1/46 | (2006.01) |
| H01J 37/32 | (2006.01) |
| H01L 21/3065 | (2006.01) |
| H01L 21/683 | (2006.01) |
| H03H 1/00 | (2006.01) |
| H01L 21/60 | (2006.01) |

(52) U.S. Cl.
CPC .......... *H05H 1/46* (2013.01); *H01J 37/32174* (2013.01); *H01J 37/32577* (2013.01); *H01J 37/32724* (2013.01); *H01J 37/32908* (2013.01); *H01L 21/3065* (2013.01); *H01L 21/6831* (2013.01); *H03H 1/0007* (2013.01); *H01L 2021/6015* (2013.01); *H03H 2001/0092* (2013.01); *H05H 2001/4682* (2013.01)

(58) Field of Classification Search
CPC ......... H01L 37/32174; H01L 37/32577; H01L 37/32724; H01L 37/32908; H01L 21/3065; H01L 21/6831; H01L 2021/6065; H05H 1/06; H05H 1/36; H03H 1/0007; H03H 2001/0092; H03H 2001/4682
USPC .............. 219/121.4, 121.41, 121.43, 121.54; 117/723, 725; 156/345.52, 345.47, 156/345.48
See application file for complete search history.

(56) References Cited

U.S. PATENT DOCUMENTS

| | | | | |
|---|---|---|---|---|
| 4,422,059 A | * | 12/1983 | Fuji | ............... H03H 7/09 333/202 |
| 5,978,446 A | * | 11/1999 | Resnick | ............... H05G 1/54 378/105 |

(Continued)

FOREIGN PATENT DOCUMENTS

| | | |
|---|---|---|
| JP | 2014-99585 A | 5/2014 |
| TW | 201421577 A | 6/2014 |

*Primary Examiner* — Mark H Paschall
(74) *Attorney, Agent, or Firm* — Rothwell, Figg, Ernst & Manbeck, P.C.

(57) ABSTRACT

A filter device includes a plurality of coils of which central axes are spaced apart from one another and in parallel to one another and a plurality of ground members spaced apart from one another and extending in parallel to the central axes of the coils outside of the coils. Each of the coils is spaced apart from another coil closest thereto by a first distance. Each of the ground members is spaced apart from a coil closest thereto by a second distance. The number of ground members spaced apart from each of the coils by the second distance is the same.

9 Claims, 23 Drawing Sheets

(56) References Cited

U.S. PATENT DOCUMENTS

| | | | |
|---|---|---|---|
| 6,489,875 | B1 | 12/2002 | Uchikoba et al. |
| 6,967,559 | B2 | 11/2005 | Beland |
| 7,511,594 | B2 * | 3/2009 | Sasaki .................. H03H 1/0007 333/132 |
| 8,421,013 | B2 | 4/2013 | Baik et al. |
| 8,680,853 | B2 * | 3/2014 | Zakosarenko ....... G01R 33/035 324/248 |
| 9,245,761 | B2 * | 1/2016 | Singh ................ H01J 37/32422 |
| 9,263,180 | B2 | 2/2016 | Yoon et al. |
| 9,720,052 | B2 * | 8/2017 | Gohara .............. G01R 33/0041 |
| 2014/0110061 | A1 | 4/2014 | Okunishi |
| 2014/0208713 | A1 | 7/2014 | Lorand |

\* cited by examiner

FILTER DEVICE AND PLASMA PROCESSING APPARATUS

CROSS-REFERENCE TO RELATED APPLICATION

This application claims priority to Japanese Patent Application No. 2016-220641 filed on Nov. 11, 2016, the entire contents of which are incorporated herein by reference.

FIELD OF THE INVENTION

The disclosure relates to a filter device and a plasma processing apparatus.

BACKGROUND OF THE INVENTION

A plasma processing apparatus is used for manufacturing electronic devices such as semiconductor devices. The plasma processing apparatus includes a chamber main body, a mounting table and a high frequency power supply. An inner space of the chamber main body serves as a chamber for performing plasma processing on a target object. The mounting table is provided in the chamber and configured to hold the target object thereon. The mounting table includes a lower electrode and an electrostatic chuck. The high frequency power supply is connected to the lower electrode.

In the plasma processing performed by the plasma processing apparatus, it is required to control in-plane temperature distribution of the target object. In order to control the in-plane temperature distribution of the target object, the mounting table may have a plurality of heaters. The heaters are connected to a power supply of a heater controller through power feed lines.

As described above, a high frequency power is supplied from the high frequency power supply to the lower electrode of the mounting table. The high frequency supplied to the lower electrode may flow into the power feed lines connecting the heaters and the heater controller. Therefore, each of the power feed lines is provided with a filter for blocking or attenuating the high frequency.

As for such a filter, there is known a filter disclosed in Japanese Patent Application Publication No. 2014-099585. This filter includes a coil and a casing. The coil forms a part of a power feed line and is accommodated in the casing. The casing is made of a conductor. A potential of the casing is set to a ground potential. In this filter, the coil and the casing form a distributed constant line. This filter has a plurality of resonance frequencies.

The coil generates heat due to the supply of AC (Alternating Current) to the heater and the supply of the high frequency power to the lower electrode. The coil is substantially accommodated in a closed casing and thus has a high temperature. Therefore, the coil needs to be cooled. As for a method for cooing the coil, there may be employed a method for forming a plurality of holes in a casing and blowing air into the casing. However, if the high frequency power is increased, this method may be insufficient to cool the coil.

In the above-described plasma processing apparatus, a plurality of heaters is used and, thus, a plurality of filters is provided in the power feed lines. It is preferable to suppress a difference in frequency characteristics of impedances of the filters.

Accordingly, it is required to decrease a temperature of the coils of the filters and suppress the difference in the impedance-frequency characteristics of the filters.

SUMMARY OF THE INVENTION

In accordance with a first aspect of the present disclosure, there is provided a filter device including: a plurality of coils of which central axes are spaced apart from one another and in parallel to one another; and a plurality of ground members spaced apart from one another and extending in parallel to the central axes of the coils outside the coils, wherein each of the coils is spaced apart from another coil closest thereto by a first distance, each of the ground members is spaced apart from a coil closest thereto by a second distance, and the number of ground members spaced apart from each of the coils by the second distance is the same.

In accordance with a second aspect of the present disclosure, there is provided a plasma processing apparatus including: a chamber main body; a mounting table provided in the chamber main body, the mounting table including a lower electrode, an electrostatic chuck and a plurality of heaters; a high frequency power supply connected to the lower electrode; the filter device described above; and a heater controller including a power supply electrically connected to the heaters, wherein the coils of the filter device form power feed lines between the heaters and the heater controller, respectively.

As described above, it is possible to decrease a temperature of the coils of the filters and suppress the difference in the impedance-frequency characteristics of the filters.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
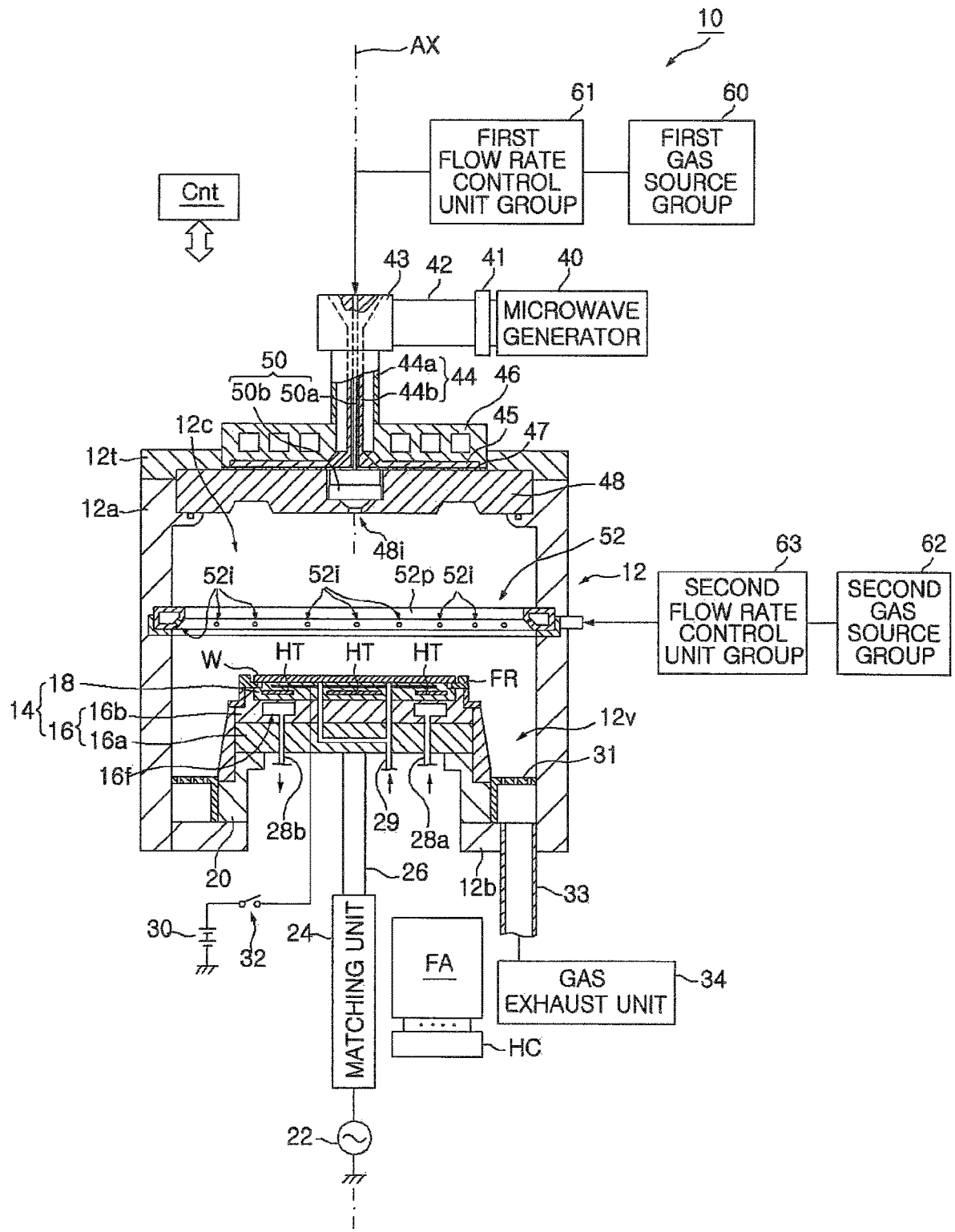
FIG. 1 schematically shows a plasma processing apparatus according to an embodiment.

Hereinafter, various embodiments will be described in detail with reference to the accompanying drawings. Like reference numerals will be used for like or corresponding parts throughout the drawings.

FIG. 1 schematically shows a plasma processing apparatus according to an embodiment. A plasma processing apparatus 10 shown in FIG. 1 generates a plasma by exciting a gas with a microwave. The plasma processing apparatus 10 includes a chamber main body 12. An inner space of the chamber main body 12 serves as a chamber 12c. The chamber main body 12 may have a sidewall 12a, a bottom portion 12b and a ceiling portion 12t.

The sidewall 12a has a substantially cylindrical shape extending in a vertical direction. A central axis of the sidewall 12a substantially coincides with an axis AX extending in the vertical direction. The bottom portion 12b extends from a lower end portion of the sidewall 12a. An upper end portion of the sidewall 12a is opened. The opening formed at the upper end portion of the sidewall 12a is blocked by a dielectric window 48. The dielectric window 48 is interposed between the upper end portion of the sidewall 12a and the ceiling portion 12t. A sealing member such as an O-ring may be provided between the dielectric window 48 and the upper end portion of the sidewall 12a to seal the chamber 12c.

The plasma processing apparatus 10 further includes a mounting table 14. The mounting table 14 is provided in the chamber 12c. The above-described dielectric window 48 is provided above the mounting table 14. The mounting table 14 is configured to hold a target object W mounted thereon. The target object W has a substantially disc shape like a wafer. The mounting table 14 has a lower electrode 16, an electrostatic chuck 18, and a plurality of heaters HT. The heaters HT are provided at a plurality of regions arranged coaxially about the central axis AX in the electrostatic chuck 18. One or more heaters HT are provided in each of the regions. Two or more heaters HT may be provided at the mounting table 14.

The lower electrode 16 includes a first member 16a and a second member 16b. The first member 16a is formed in a substantially disc shape and made of a metal (e.g., aluminum). The first member 16a is supported by a supporting member 20. The supporting member 20 has a substantially cylindrical shape. The supporting member 20 extends upward from the bottom portion 12b of the chamber main body 12. The second member 16b is provided on the first member 16a. The second member 16b is formed in a substantially disc shape and made of a metal (e.g., aluminum). The second member 16b is electrically connected to the first member 16a.

A high frequency power supply 22 is connected to the lower electrode 16 via a matching unit 24 and a power feed conductor 26 (e.g., power feed rod). The high frequency power supply 22 generates a high frequency power. The high frequency power may be a bias high frequency power for attracting active species such as ions generated in the chamber 12c to the target object W. The high frequency power may have a frequency of, e.g., 13.56 MHz, but is not limited thereto. The matching unit MU has a matching circuit for matching an impedance of the high frequency power 22 side and an impedance of a load side, mainly the electrode, the plasma and the chamber main body 12.

The electrostatic chuck 18 is provided on the lower electrode 16. The electrostatic chuck 18 has a film-shaped electrode embedded in a substantially disc-shaped insulator. A DC (Direct Current) power supply 30 is connected to the electrode of the electrostatic chuck 18 via a switch 32. When a voltage is applied from the DC power supply 30 to the electrode of the electrostatic chuck 18, the electrostatic chuck 18 generates an electrostatic force. The target object W mounted on the electrostatic chuck 18 is held by the electrostatic force thus generated. In the case of performing a plasma process, a focus ring FR is provided to surround an edge of the electrostatic chuck 18 and an edge of the target object W.

A passage 16f is formed in the second member 16b of the lower electrode 16. Lines 28a and 28b are connected to the passage 16f and also connected to a chiller unit. The chiller unit is provided at an outer side of the chamber main body 12. A coolant is supplied from the chiller unit to the passage 16f through the line 28a. The coolant supplied to the passage 16f returns to the chiller unit through the line 28b. By controlling a temperature of the coolant supplied to the passage 16f, a temperature of the target object W held on the mounting table 14 is controlled. In the plasma processing apparatus 10, a heat transfer gas supply line 29 extends to a top surface of the electrostatic chuck 18 while passing through the lower electrode 16. A heat transfer gas, e.g., He gas, from the heat transfer gas supply unit is supplied to a gap between the top surface of the electrostatic chuck 18 and the backside of the target object W through the heat transfer gas supply line 29.

A plurality of heaters HT is embedded in the electrostatic chuck 18. The heaters HT are connected to a heater controller HC through a plurality of power feed lines. The heater controller HC includes a power supply for supplying an AC output to the heaters HT. A plurality of filters of a filter device FA is provided on the power feed lines. The filter device FA will be described in detail later.

An annular gas exhaust path 12v is provided around the mounting table 14, i.e., between the mounting table 14 and the sidewall 12a of the chamber main body 12. A baffle plate 31 is provided at an intermediate portion in the gas exhaust path 12v in the direction of the axis line AX. A plurality of through-holes is formed in the baffle plate 31 while penetrating therethrough in a thickness direction thereof. A gas exhaust line 33 is connected to the bottom portion 12b of the chamber main body 12 to communicate with the gas exhaust path 12v. A gas exhaust unit 34 is connected to the gas exhaust line 33. The gas exhaust unit 34 has a pressure controller and a vacuum pump such as a turbo molecular pump. A pressure in the chamber 12c is reduced by the gas exhaust unit 34.

The plasma processing apparatus 10 may further include a microwave generator 40, a tuner 41, a waveguide 42, a mode transducer 43, a coaxial waveguide 44, a dielectric plate 45, a cooling jacket 46, an antenna 47 and a dielectric window 48. The microwave generator 40 generates a microwave to be supplied to the antenna 47. The microwave generated by the microwave generator 40 may have a frequency of, e.g., 2.45 GHz. The microwave generator 40 is connected to an upper portion of the coaxial waveguide 44 through the tuner 41, the waveguide 42 and the mode transducer 43. The coaxial waveguide 44 extends in a vertical direction. A central axis line thereof substantially coincides with the axis line AX.

The coaxial waveguide 44 includes an outer conductor 44a and an inner conductor 44b. The outer conductor 44a and the inner conductor 44b have a cylindrical shape and share the axis line AX as the central axis line. A lower end of the outer conductor 44a can be electrically connected to an upper portion of the cooling jacket 46 having a conductive surface. The inner conductor 44b is coaxially disposed within the outer conductor 44a. A lower end of the inner conductor 44b is connected to the antenna 47.

In one embodiment, the antenna 47 is a radial line slot antenna. The antenna 47 is provided in the opening formed at the ceiling portion 12t and positioned on the top surface of the dielectric window 48.

A dielectric plate 45 is provided on the antenna 47. The dielectric plate 45 has a substantially disc shape and reduces a wavelength of a microwave. The dielectric plate 45 is made of, e.g., quartz or alumina. The dielectric plate 45 is interposed between the antenna 47 and the bottom surface of the cooling jacket 46.

Figure 2:
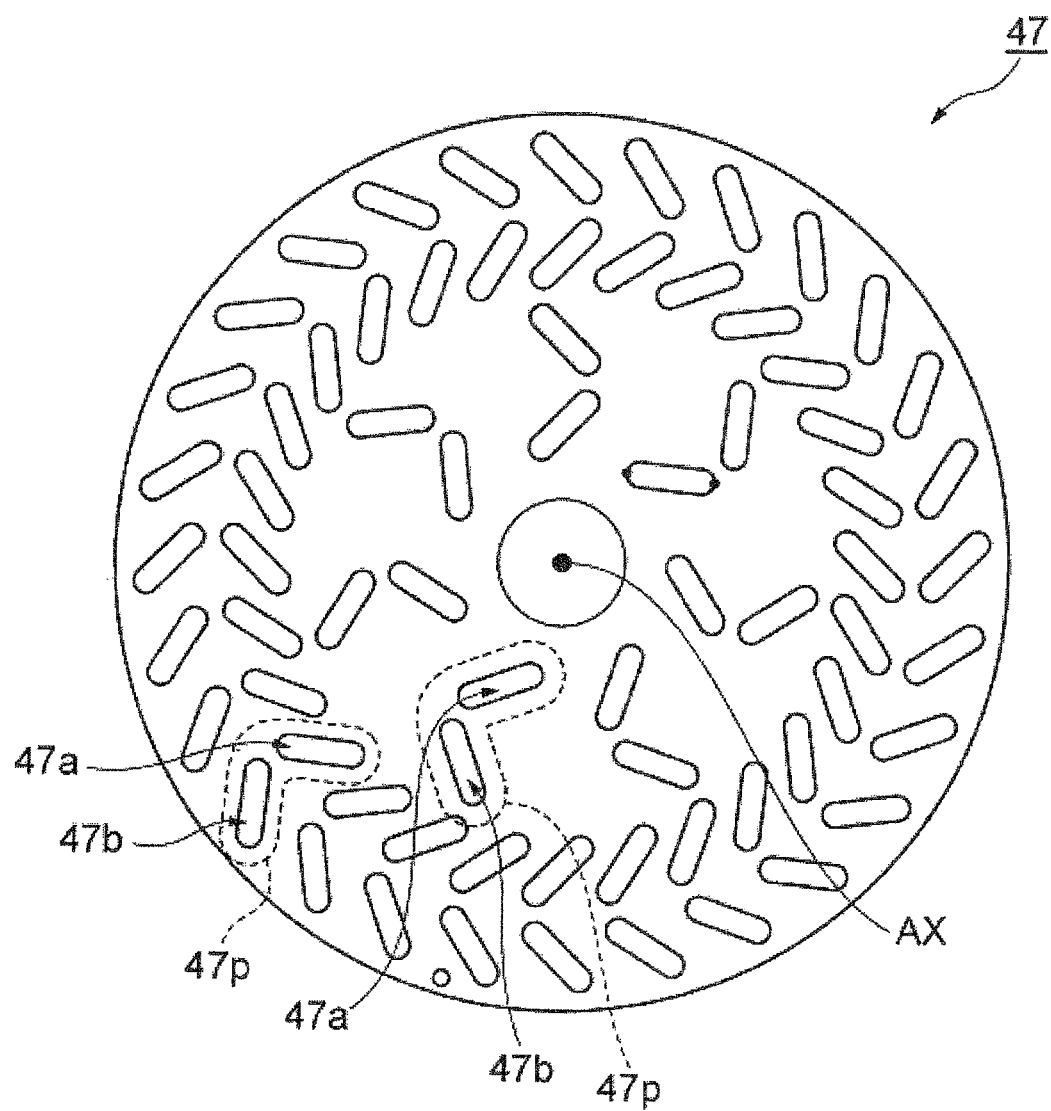
FIG. 2 is a top view showing an antenna of the plasma processing apparatus shown in FIG. 1.

FIG. 2 is a top view showing the antenna of the plasma processing apparatus shown in FIG. 1. The antenna 47 has a disc-shaped thin plate. The center of the antenna 47 is positioned on the axis line AX. A plurality of slot pairs 47p is formed in the antenna 47. The slot pairs 47p are arranged along a circumferential direction in multiple regions of the antenna 47 which are coaxially arranged about the axis line AX. Each of the slot pairs 47p includes two slot holes 47a and 47b penetrating in a plate thickness direction. Each of the slot holes 47a and 47b has an elongated hole shape when seen from the top. In each of the slot pairs 47p, a major axis of the slot hole 47a and a major axis of the slot hole 47b extend in directions intersecting with or perpendicular to each other.

Referring back to FIG. 1, in the plasma processing apparatus 10, a microwave in a TE mode from the microwave generator 40 is transmitted to the mode transducer 43. The mode transducer 43 converts the microwave from the TE mode to a TEM mode. The microwave converted to the TEM mode is transmitted through the slot holes 47a and 47b to the dielectric window 48 via the coaxial waveguide 44 and the dielectric plate 45.

The plasma processing apparatus 10 further includes a gas supply system. In one embodiment, the gas supply system includes a central supply unit 50 and a peripheral supply unit 52. The central supply unit 50 has a line 50a, an injector 50b and a central inlet port 48i. The line 50a passes through an inner bore of the inner conductor 44b of the coaxial waveguide 44. An end portion of the line 50a extends to a space defined by the dielectric window 48 along the axis line AX. The injector 50b is accommodated in the space and positioned below the end portion of the line 50a. A plurality of through-holes extending along the axis line AX is formed at the injector 50b. The dielectric window 48 defines a central inlet port 48i. The central inlet port 48i extends along the axis line AX to a position below the space where the injector 50b is accommodated. The central supply unit 50 configured as described above supplies a gas to the injector 50b through the line 50a and injects the gas from the injector 50b through the central inlet port 48i. The central supply unit 50 injects the gas to a position directly below the dielectric window 48 along the axis line AX. In other words, the central supply unit 50 introduces the gas into a plasma generation region where an electron temperature is high. The central supply unit 50 generates a flow of gas mainly toward a central region of the target object W.

The peripheral supply unit 52 provides a plurality of peripheral introduction ports 52i. The peripheral introduction ports 52i supply a gas mainly to an edge region of the target object W. The peripheral introduction ports 52i are opened toward the edge region of the target object W or toward a peripheral portion of the electrostatic chuck 18. The peripheral introduction ports 52i are arranged along the circumferential direction below the central supply unit 50 and above the mounting table 14. In other words, the peripheral introduction ports 52i are arranged along the circumferential direction about the axis line AX in a region (plasma diffusion region) where the electron temperature is lower than in the region immediately below the dielectric window 48. The peripheral supply unit 52 supplies a gas from the low electron temperature region toward the target object W. Therefore, the degree of dissociation of the gas introduced from the peripheral supply unit 52 into the chamber 12c is lower than that of the gas introduced from the central supply unit 50 into the chamber 12c.

The peripheral supply unit 52 has an annular line 52p. The peripheral introduction ports 52i are formed at the line 52p. The line 52p may be made of, e.g., quartz. In one embodiment, the line 52p is extended along an inner wall surface of the sidewall 12a.

A first gas source group 60 is connected to the central supply unit 50 through a first flow rate control unit group 61. A second gas source group 62 is connected to the peripheral supply unit 52 through a second flow rate control unit group 63.

The first gas source group 60 includes a plurality of gas sources. The first flow rate control unit group 61 has a plurality of flow rate control units. Each of the flow rate control units of the first flow rate control unit group 61 has, e.g., two valves and a flow rate controller disposed between the two valves. The flow rate controller is, e.g., a mass flow controller or a pressure control type flow rate controller. Each of the gas sources of the first gas source group 60 is connected to the line 50a of the central supply unit 50 through a flow rate control unit corresponding thereto among the flow rate control units of the first flow rate control unit group 61.

The second gas source group 62 includes a plurality of gas sources. The second flow rate control unit group 63 has a plurality of flow rate control units. Each of the flow rate control units of the second flow rate control unit group 63 has, e.g., two valves and a flow rate controller disposed between the two valves. The flow rate controller is, e.g., a mass flow controller or a pressure control type flow rate controller. Each of the gas sources of the second gas source group 62 is connected to the line 52p of the peripheral supply unit 52 through a flow rate control unit corresponding thereto among the flow rate control units of the second flow rate control unit group 63.

The plasma processing apparatus 10 further includes a control unit Cnt. The control unit Cnt may be a programmable computer device. The control unit Cnt may have a processor and a storage unit such as a memory. The control unit Cnt can control the respective components of the plasma processing apparatus 10 based on a control program and a recipe stored in the storage unit.

Figure 3:
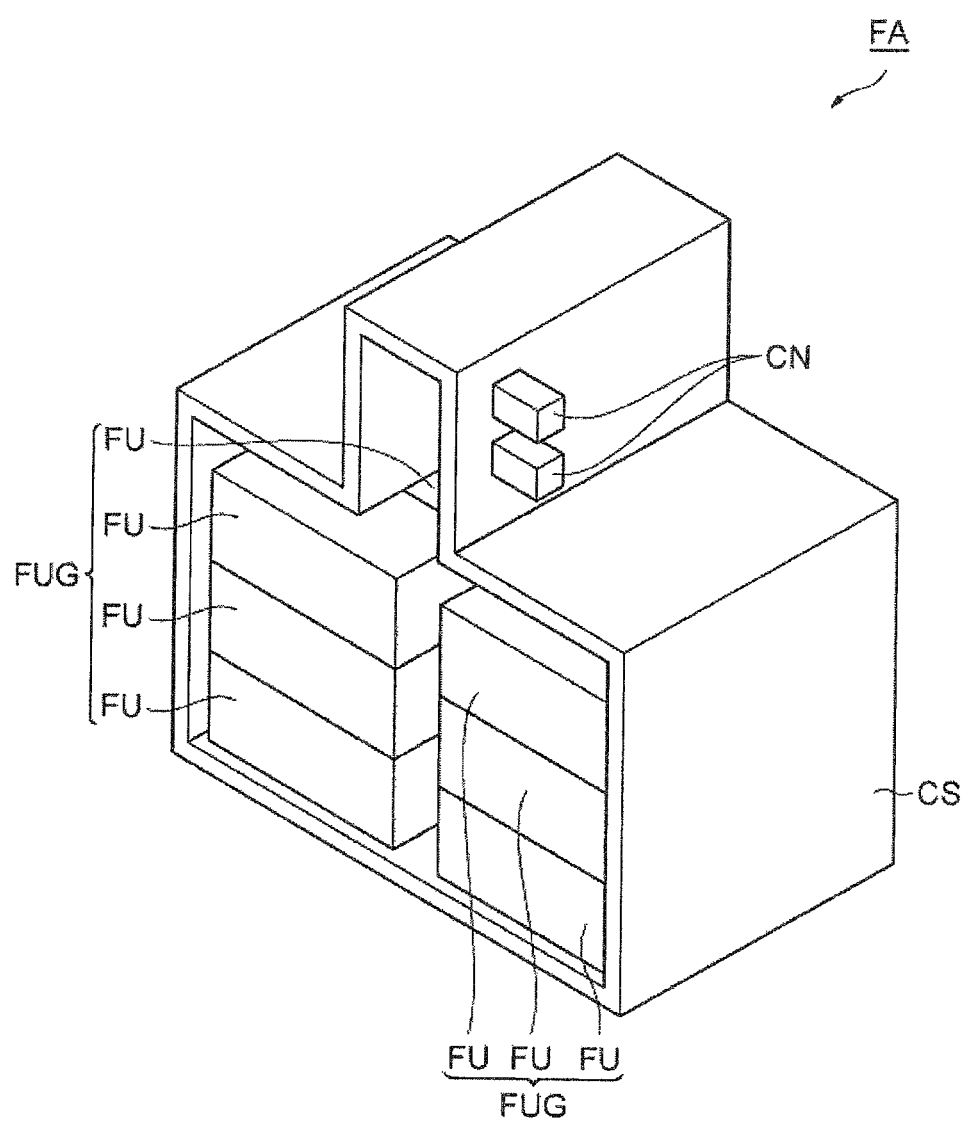
FIG. 3 is a perspective view of a filter device according to an embodiment.

Hereinafter, the filter device FA of the plasma processing apparatus 10 will be described in detail. FIG. 3 is a perspective view of the filter device according to an embodiment. As shown in FIG. 3, the filter device FA includes a plurality of filter units FU connected to a plurality of heaters HT. Each of the filter units FU blocks or attenuates a high frequency on the power feed line that connects the heater HT corresponding thereto and the heater controller HC. The filter device FA includes two or more filter units FU. In the present embodiment, the number of the filter units FU is equal to that of the heaters HT.

Figure 4:
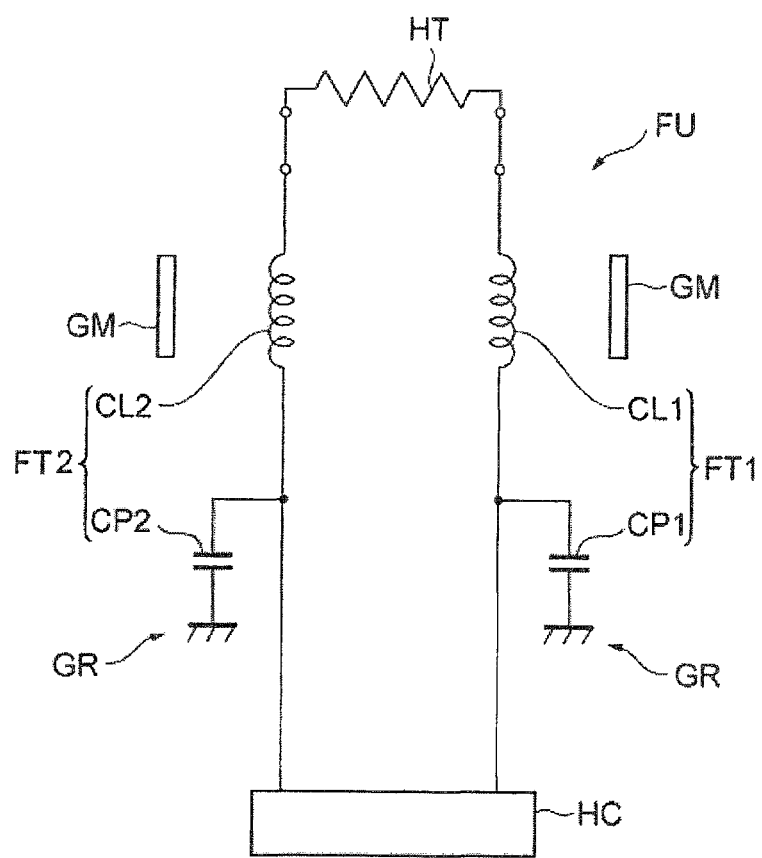
FIG. 4 is a circuit diagram of a filter unit.

FIG. 4 is a circuit diagram of the filter unit. Each of the filter units FU includes filters FT1 and FT2. The filter FT1 has a coil CL1 and a capacitor CP1. The filter FT2 has a coil CL2 and a capacitor CP2. The coil CL1 forms a part of the power feed line that connects one end of the heater HT corresponding thereto and the heater controller HC. The coil CL2 forms a part of the power feed line that connects the other end of the heater HT and the heater controller HC. One end of the capacitor CP1 is connected to a node on the power feed line between the coil CL1 and the heater controller HC. A potential of the other end of the capacitor CP1 is set to a ground potential. One end of the capacitor CP2 is connected to a node on the power feed line that connects the coil CL2 and the heater controller HC. A potential of the other end of the capacitor CP2 is set to a ground potential.

As will be described later, one or more ground members GM are provided around the coils CL1 and CL2. A potential of the ground members GM is set to a ground potential. The coil CL1 and the ground member GM form a distributed constant line. The coil CL2 and the ground member GM form a distributed constant line. Therefore, each of the filters FT1 and FT2 is configured as a distributed constant type filter. Each of the filters FT1 and FT2 has frequency-impedance characteristics, the frequency including a plurality of resonance frequencies. In other words, each of the filters FT1 and FT2 has impedance peaks at the resonance frequencies.

A plurality of resonance frequencies is specified by an inductance per unit length of the coil (the coil CL1 or CL2) and an electrostatic capacity per unit length. An inter-wiring capacitance per unit length is specified by an electrostatic capacity of a capacitor connected to the coil, an electrostatic capacity between the ground member GM and the coil, and an electrostatic capacity between the windings of the coil.

Referring back to FIG. 3, in the example shown in FIG. 3, a plurality of filter units FU form two filter unit groups FUG. There may be one or more filter unit groups, each including a plurality of filter units FU. As shown in FIG. 3, these filter unit groups FUG are provided in a case CS. The case CS is opened so that convection of air occurs between an inner space of the case CS and the outside. A plurality of connectors CN is attached to the case CS and protrudes from the surface of the case CS. Each of the connectors CN has a plurality of terminals. Terminals of one or more connectors among the plurality of connectors CN are connected to the coils CL1 and CL2 of the filter units FU. These terminals are connected to the heaters HT. The terminals of one or more connectors among the plurality of connectors CN are also connected to the heater controller HC.

Figure 5:
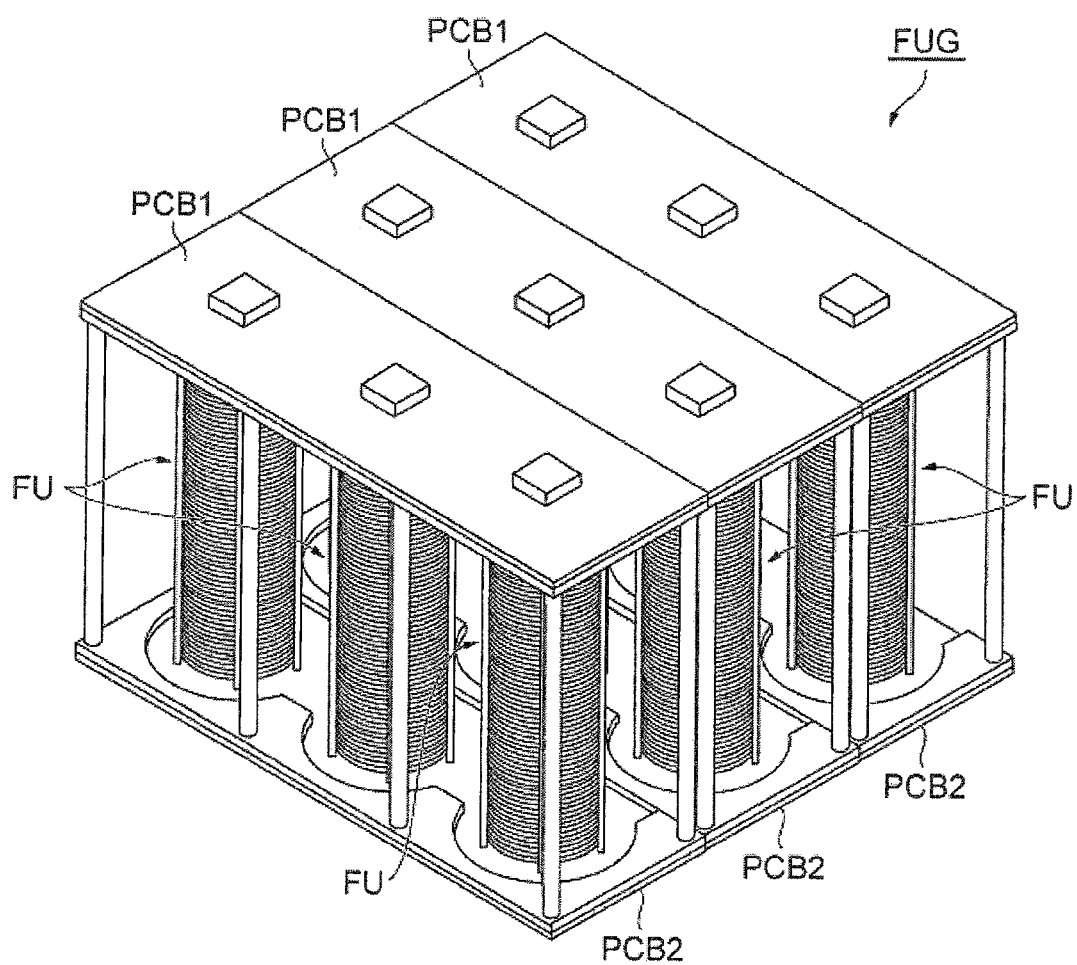
FIG. 5 is a perspective view showing a filter unit group of the filter device shown in FIG. 3.

FIG. 5 is a perspective view showing the filter unit group of the filter device shown in FIG. 3. The filter unit group FUG shown in FIG. 5 includes nine filter units FU. Two or more filter units FU may be included in the filter unit group FUG.

The filter device FA further includes one or more first printed circuit boards PCB1 and one or more second printed circuit boards PCB2. In the example shown in FIG. 5, the filter unit group FUG includes three first printed circuit boards PCB1 and three second printed circuit boards PCB2. The first printed circuit boards PCB1 are in parallel to the second printed circuit boards PCB2 corresponding thereto. In other words, the first printed circuit boards PCB1 are positioned to face the second printed circuit boards PCB2 corresponding thereto. In the example shown in FIG. 5, one of the first printed circuit boards PCB1 and one of the second printed circuit boards PCB2 which corresponds thereto are shared by three filter units FU. The number of the first printed circuit boards PCB1 and the number of the second printed circuit boards PCB2 may be equal to or smaller than the number of the filter units FU.

Figure 6:
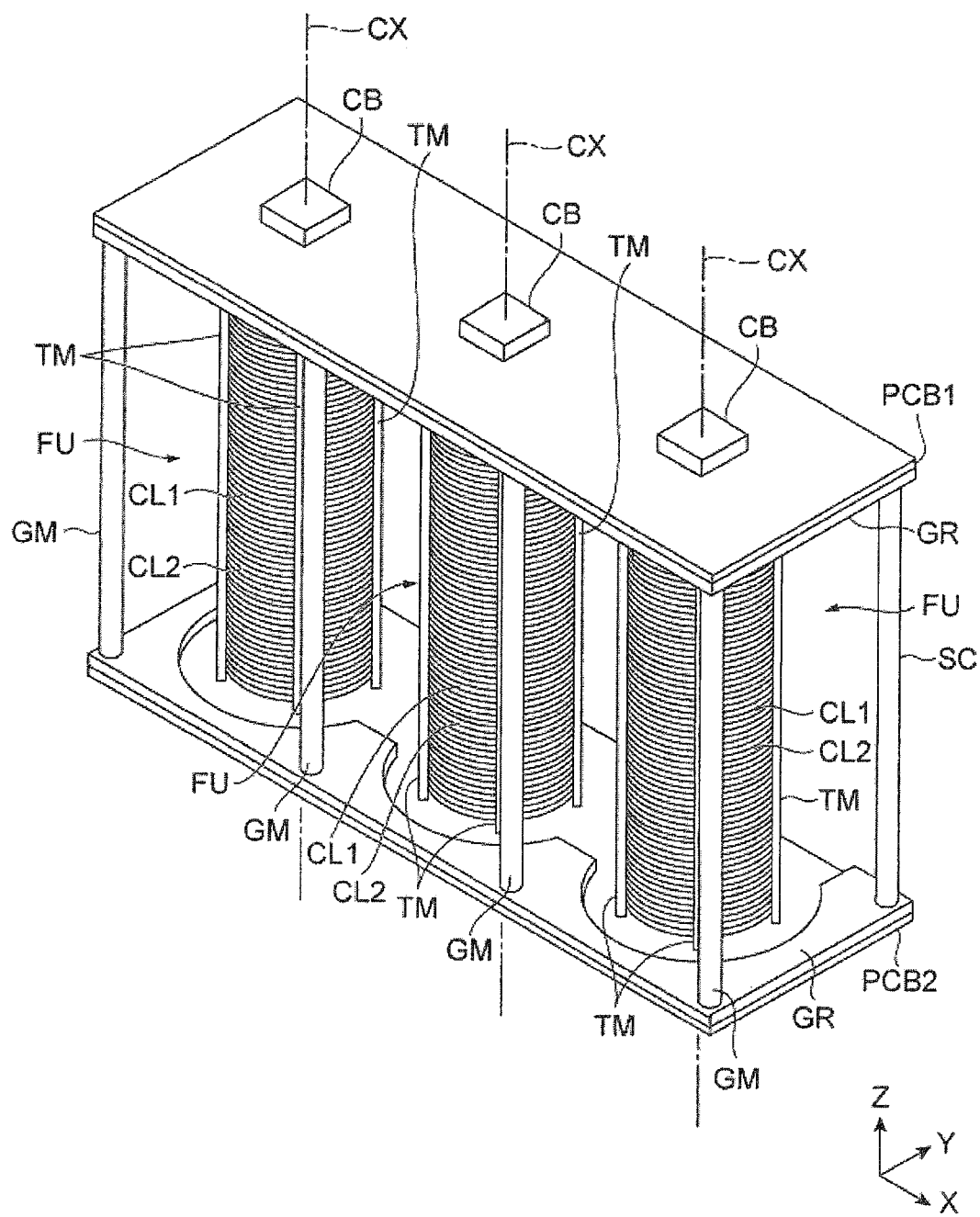
FIGS. 6 and 7 are perspective views showing a plurality of filter units which shares two printed circuit boards.
Figure 7:
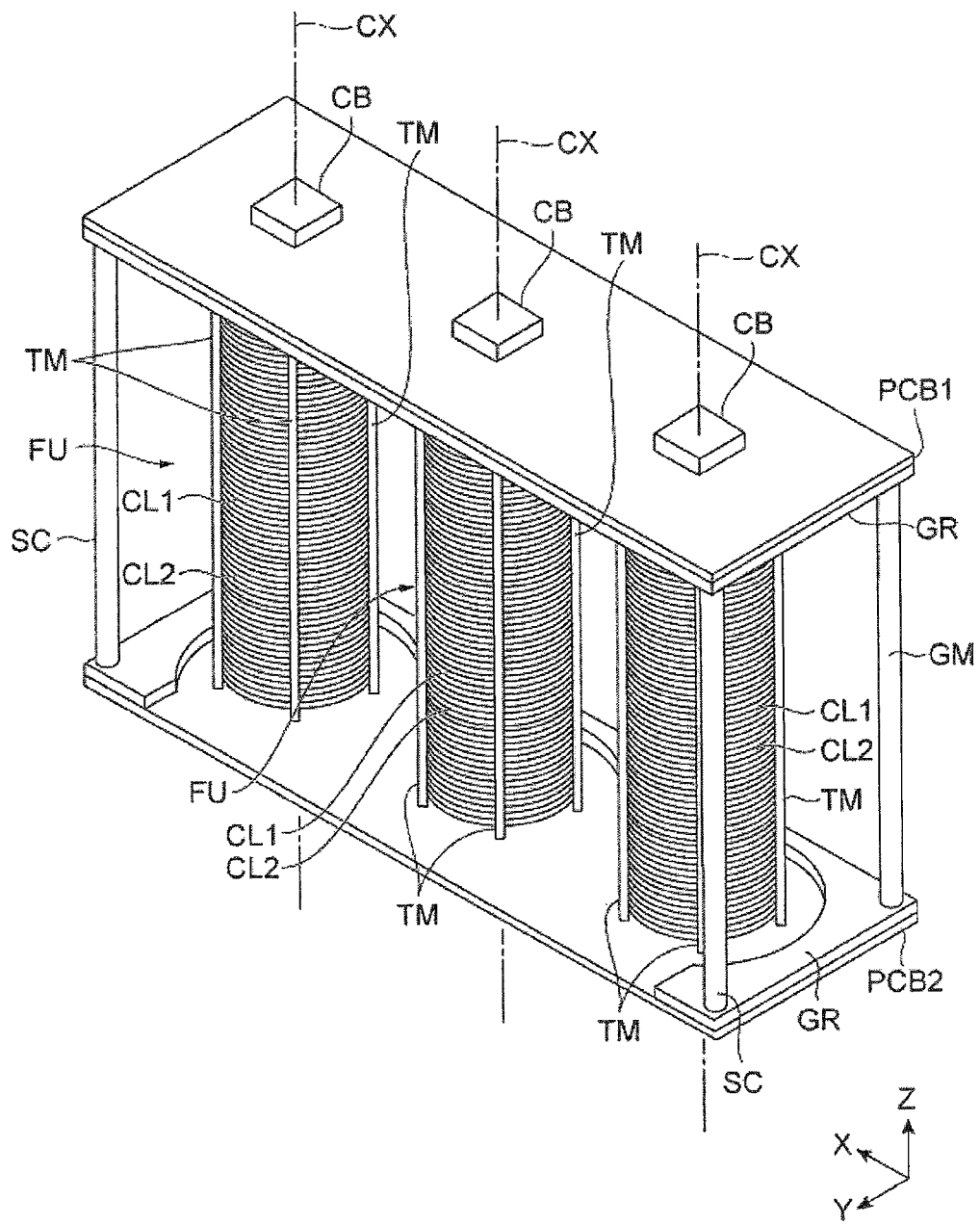
Figure 8:
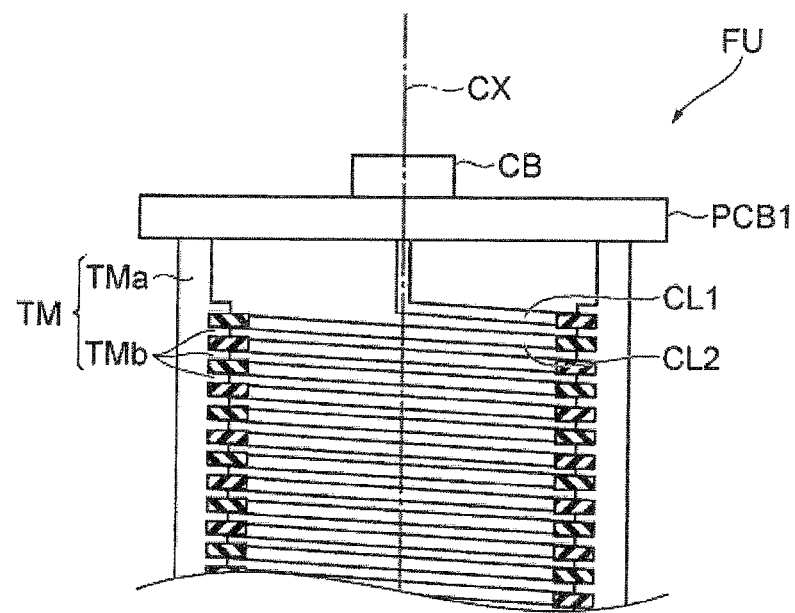
FIG. 8 is a cross sectional view of the filter unit.
Figure 8:
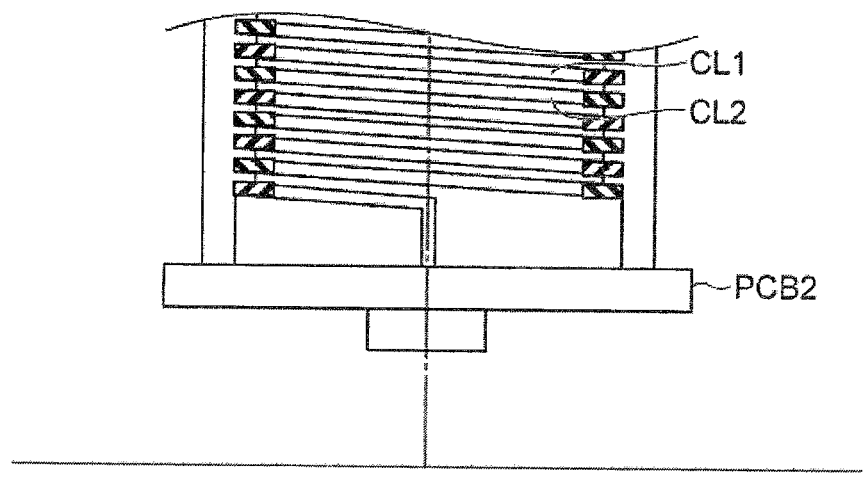
Figure 9:
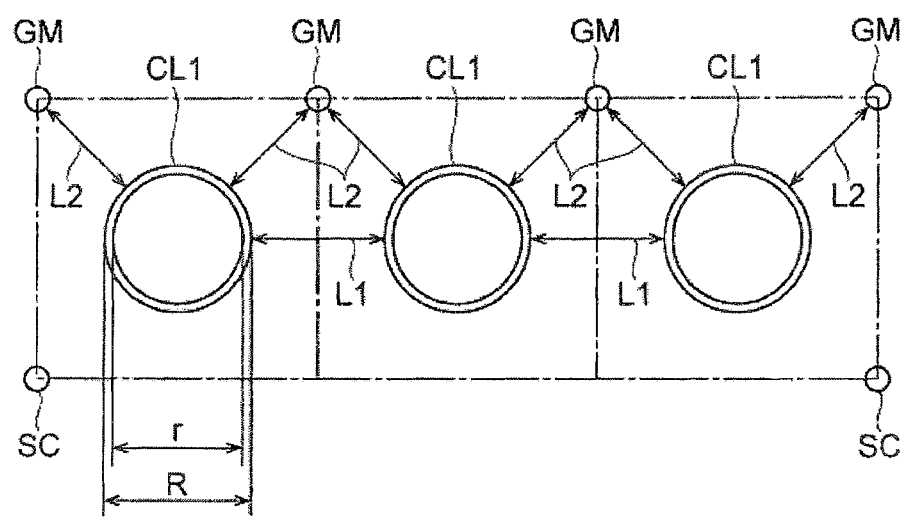
FIG. 9 shows a layout of ground members and coils in three filter units.

FIGS. 6 and 7 are perspective views of a plurality of filter units sharing two printed circuit boards. In other words, FIGS. 6 and 7 show three filter units FU sharing one of the first printed circuit board PCB1 and one of the second printed circuit board PCB2 which corresponds thereto among the filter units FU shown in FIG. 5. In FIG. 6, three filter units FU seen from the Y direction are illustrated. In FIG. 7, three filter units FU seen from the opposite direction to that in FIG. 6 (i.e., −Y direction) are illustrated. FIG. 8 is a cross sectional view of the filter unit. FIG. 9 shows a layout of the coils and the ground members in the three filter units. Hereinafter, FIGS. 6 to 9 will be referred to together with FIG. 5.

In each of the filter units FU, the windings of the coil CL1 and the windings of the coil CL2 is wound in a spiral shape around a central axis CX. The windings of the coil CL1 and the windings of the coil CL2 are alternately wound along an extension direction of the central axis CX. The first printed circuit board PCB1 is provided at one ends of the coil CL1 and the coil CL2. The second printed circuit board PCB2 is provided at the other ends of the coil CL1 and the coil CL2. The coil CL1 and the coil CL2 are supported by the first printed circuit board PCB1 and the second printed circuit board PCB2.

A capacitor box CB is mounted on the first printed circuit board PCB1. The capacitor box CB accommodates therein capacitors CP1 and CP2. Terminals of the coils CL1 and CL2 are provided at the second printed circuit board PCB2. Further, the terminals of the coils CL1 and CL2 are electrically connected to terminals corresponding thereto in the connectors CN. A ground region GR is provided at the first printed circuit board PCB1. The other ends of the capacitors CP1 and CP2 are electrically connected to the ground region GR of the first printed circuit board PCB1. A ground region GR is also provided at the second printed circuit board PCB2. The ground regions GR are made of a conductor. A potential of the ground region GR is set to a ground potential. The ground region GR of the first printed circuit board PCB1 and the ground region GR of the second printed circuit board PCB2 have substantially the same pattern.

The filter unit FU further includes a plurality of comb-shaped members TM. In one example, each of the filter units FU has four comb-shaped members TM. The number of the comb-shaped members TM in each of the filter units FU may vary. A plurality of comb-shaped members TM is substantially uniformly arranged along the circumferential direction about the central axis CX. Each of the comb-shaped members TM may be made of an insulator, e.g., resin such as PEEK or PCTFE. Each of the comb-shaped members TM may has a columnar portion TMa and a plurality of teeth TMb. The columnar portion TMa has a columnar shape and extends substantially in parallel to the central axis CX. One end of the columnar portion TMa is fixed to the first printed circuit board PCB1. The other end of the columnar portion TMa is fixed to the second printed circuit board PCB2. Each of the teeth TMb has a thin plate shape. Each of the teeth TMb extends in a direction intersecting with or perpendicular to the central axis CX toward the central axis CX from a surface of the columnar portion TMa facing the central axis CX.

The comb-shaped members TM provide slots between the adjacent teeth TMb in the extension direction of the central axis CX. In other words, the comb-shaped members TM provide a plurality of slots arranged along the extension direction of the central axis CX. The windings of the coil CL1 and the windings of the coil CL2 are inserted into the slots provided by the comb-shaped members TM. Accordingly, a plurality of pitches of the windings of the coil CL1 (pitches between windings) and a plurality of pitches of the windings of the coil CL2 (pitches between windings) are specified. The pitches of the coil CL1 may be the same, or one or more pitches of the coil CL1 may be different from the other pitches. In the same manner, the pitches of the coil CL2 may be the same, or one or more pitches of the coil CL2 may be different from the other pitches. One or more specific resonance frequencies of the filter having a coil of which one or more pitches are different from the other pitches become different from resonance frequencies of a filter having a coil having the same pitch. In other words, by setting one or more pitches of the coil to be different from the other pitches, one or more specific resonance frequencies of the filter having the corresponding coil can be controlled.

As shown in FIGS. 5 to 7, the coils CL1 of the filter units FU are arranged such that the central axes CX thereof are spaced apart from one another and in parallel to one another. The coils CL2 share the central axes CX with the coils CL1 corresponding thereto. Therefore, the coils CL2 are also arranged such that the central axes CX thereof are spaced apart from one another and in parallel to one another.

In the filter device FA, a plurality of ground members GM extends in parallel to the central axes CX at the outer side of the coils CL1 and CL2. The ground members GM are spaced apart from one another. The ground members GM are made of a conductor. The potential of the ground members GM is set to a ground potential. In one embodiment, the potential of the ground members GM is connected to the ground region GR of the first printed circuit board PCB1.

In one embodiment, the ground members GM have a columnar shape and constitute columns for supporting one or more first printed circuit boards PCB1 and one or more second printed circuit boards PCB2. In the example shown in FIGS. 5 to 7, one of the first printed circuit boards PCB1 and one of the second printed circuit boards PCB2 which corresponds thereto are supported by four ground members GM. The four ground members GM extend between one edge portion extending in a lengthwise direction of one first printed circuit board PCB1 and one edge portion extending in a lengthwise direction of one second printed circuit board PCB2 which corresponds thereto. Two or more columns SC extend between another edge opposite to the one edge in the first printed circuit board PCB1 and another edge opposite to the one edge in the second printed circuit board PCB2 which corresponds thereto. The columns SC are made of an insulator and support the first printed circuit board PCB1 and the second printed circuit board PCB2 which corresponds thereto.

Hereinafter, a layout of a plurality of coils CL1 and a plurality of ground members GM will be described with reference to FIGS. 5 to 7 and FIG. 9. Since the coils CL2 share the central axes CX with the coils CL1 corresponding thereto, the layout of the coils CL2 and the ground members GM is the same as that of the coils CL1 and the ground members GM which will be described below. Therefore, the description of the layout of the coils CL2 and the ground members GM will be omitted.

The layout of the coils CL1 and the ground members GM satisfy the following three conditions. Firstly, each of the coils CL1 is spaced apart from another coil CL1 closest thereto by a first distance L1. The first distance L1 is a shortest distance between outer peripheral surfaces of two coils CL1 closest to each other. Secondly, each of the ground members GM is spaced apart from a coil CL1 closest thereto by a second distance L2. The second distance L2 is a shortest distance between outer peripheral surfaces of the ground members GM and outer peripheral surfaces of the coils CL1 closest thereto. Thirdly, the number of ground members GM spaced apart from each of the coils CL1 by the second distance L2 is the same. In other words, the number of ground members GM closest to each of the coils CL2 is the same.

The layout shown in FIGS. 6, 7 and 9 satisfies the above-described three conditions. In this layout, three coils CL1 are provided with four ground members GM. The three coils CL1 are arranged along one direction. The four ground members GM are arranged at a regular interval on the plane in parallel to the plane including three central axes CX of the three coils CL1. The number of ground members GM closest to each of the three coils CL1 is two. One of the two ground members GM closest to each of the coils CL1 is also closest to another coil CL1. In other words, in the layout shown in FIG. 9, on a cross section perpendicular to the central axis CX, the centers of the three coils CL1 coincide with centers of three squares consecutively arranged along one direction. Further, on the cross section perpendicular to the central axis CX, four ground members GM are positioned on four corners on three consecutive sides of the three squares.

In the layout shown in FIGS. 6, 7 and 9, a unit structure including one coil CL1 and two coils closest thereto is arranged along one direction (X direction in FIG. 9). This layout satisfies translational symmetry. In the filter unit group FUG shown in FIG. 5, there is employed a layout in which 3×3 unit structures are arranged along one direction and another direction perpendicular thereto. This layout also satisfies the translational symmetry.

As described above, in the filter device FA, the ground members GM are spaced apart from one another. In other words, each of the ground members GM provides a space between itself and another ground member GM. Therefore, the coils CL1 and CL2 are not provided in a closed space in the casing of which potential is set to the ground potential, and heat radiation of the coils CL1 and CL2 is promoted by convection of air which occurs between the inside and the outside of the filter device FA. Accordingly, in this filter device FA, the temperatures of the coils CL1 and CL2 are decreased.

Each of the coils CL1 is equally spaced apart from a coil CL1 closest thereto by the first distance L1. Therefore, each of the coils CL1 is interfered by another coil CL1 closest thereto in substantially the same way. Each of the coils CL2 is equally spaced apart from a coil CL2 closest thereto by the first distance L1. Therefore, each of the coils CL2 is interfered by another coil CL2 closest thereto in substantially the same way. The number of the ground members GM closest to each of the coils CL1 is the same. Each of the coils CL1 is equally spaced apart from the ground member GM closest thereto by the second distance L2. The number of the ground members GM closest to each of the coils CL2 is the same. Each of the coils CL2 is equally spaced apart from the ground member GM closest thereto by the second distance L2. Therefore, a capacity difference between each of the coils CL1 and a ground member GM close thereto is reduced and a capacity difference between each of the coils CL2 and a ground member GM close thereto is reduced. Accordingly, a difference in the impedance-frequency characteristics of the filters FT1, each including a plurality of coils CL1, is reduced and a difference in the impedance-frequency characteristics of the filters FT2, each including a plurality of coils CL2, is reduced.

In one embodiment, the first distance L1 is greater than ½ of an inner diameter r of each of the coils CL1 and CL2 and smaller than the distance three times greater than the inner diameter r. In this embodiment, the difference in the impedance-frequency characteristics of the filters FT1 and FT2 are further reduced.

In one embodiment, the second distance L2 is greater than or equal to 12.7 mm and smaller than or equal to 16.4 mm. By setting a distance between the ground member GM and the coils CL1 and CL2 closest thereto to 12.7 mm or above, it is possible to more reliably prevent discharge from occurring between the coils CL1 and CL2 and the ground member GM. The dependency of the impedance-frequency characteristics of the filter on the distance between the ground member GM and the coil closest to the ground member GM is suppressed when the distance is 16.4 mm or less.

Hereinafter, a result of first simulation on the impedance-frequency characteristics of three filters FT1 arranged in the layout shown in FIGS. 5, 6 and 9 will be described. In the first simulation, the following setting was used.

Figure 10A:
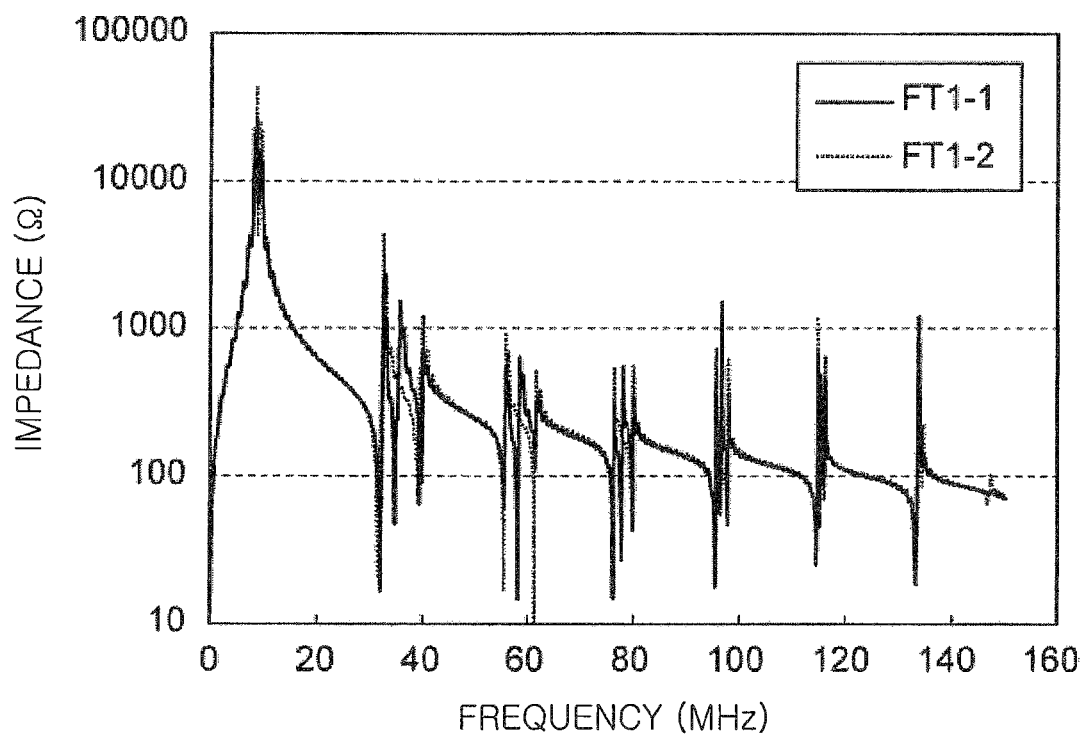
FIGS. 10A and 10B show results of first simulation.
Figure 10B:
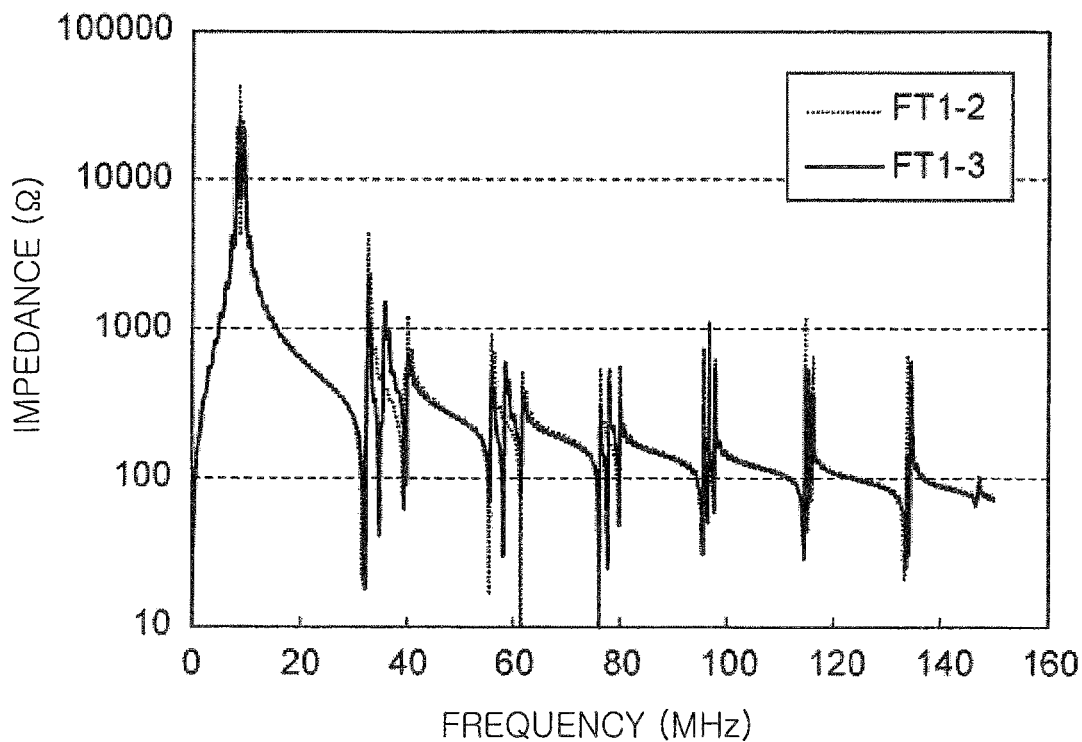

<Setting of First Simulation>
Inner diameter r of the coil CL1: 41 mm
Outer diameter R of the coil CL1: 47 mm
Shape of windings of the coil CL1: straight angle shape of 3.0 mm×0.8 mm
The number of turns of the coil CL1: 48 turns
Length of the coil CL1: 144 mm
Electrostatic capacitance of the capacitor CP1: 2700 pF In the first simulation, the impedance-frequency characteristics of the three filters FT1 were obtained. FIGS. 10A and 10B show the result of the first simulation. The horizontal axis and the vertical axis of the graphs shown in FIGS. 10A and 10B represent the frequency and the impedance, respectively. The characteristics of the filter FT1-2 shown in FIGS. 10A and 10B are the impedance-characteristics of the central filter FT1 among the three filters FT1. The characteristics of the filter FT1-1 shown in FIGS. 10A and 10B are the impedance-frequency characteristics of the filter FT1 positioned at one side of the central filter FT1. The characteristics of the filter FT1-3 shown in FIGS. 10A and 10B are the impedance-frequency characteristics of the filter FT1 positioned at the other side of the central filter FT1.

The filter FT1 has one resonance frequency in each of a plurality of frequency bands when a coil of another filter is not wound around the coil of the filter FT1. However, as shown in FIGS. 10A and 10B, in the characteristics of the filter FT1-2, i.e., the central filter FT1, two resonance frequencies appear in each frequency band. This is because the coil of the filter FT1-2 is interfered by the coil of the filter FT1-1 and the coil of the filter FT1-3 in substantially the same way. In the characteristics of the filters FT1-1 and FT1-3, three resonance frequencies appear in each frequency band. This is because the coil of the filter FT1-1 and the coil of the filter FT1-3 are interfered by coils of two different filters FT1 in different ways. The three filters FT1 have different impedances in the frequency band including the resonance frequency and thus cannot be used for blocking or attenuating the high frequency included in the corresponding frequency band. However, as shown in FIGS. 10A and 10B, the impedances of the three filters FT1 substantially coincide with one another in different frequency bands. Therefore, it is possible to use three filters FT1 in order to block or attenuate the high frequency included in the corresponding frequency bands.

Hereinafter, a result of second simulation on the first distance L1 will be described. In the second simulation, the impedance-frequency characteristics of the filters FT1 were obtained while using the first distance L1 between the coils CL1 of two filters FT1 as a variable parameter. In the second simulation, the first distance L1 was set to 60 mm (three times greater than the inner diameter r of the coil CL1), 20 mm (equal to the inner diameter r of the coil CL1), 10 mm (½ of the inner diameter r of the coil CL1) and 5 mm (¼ of the inner diameter r of the coil CL1). In the second simulation, the following setting was used.

<Setting of Second Simulation>
Inner diameter r of the coil CL1: 20 mm
Outer diameter R of the coil CL1: 23 mm
Shape of windings of the coil CL1: straight angle shape of 1.5 mm×0.4 mm
The number of turns of the coil CL1: 48 turns
Length of the coil CL1: 72 mm
Electrostatic capacitance of the capacitor CP1: 2700 pF FIGS. 11A, 11B, 12A and 12B show the result of the second simulation. The horizontal axis and the vertical axis in the graphs shown in FIGS. 11A, 11B, 12A and 12B represent the frequency and the impedance, respectively. In the graphs shown in FIGS. 11A, 11B, 12A and 12B, the characteristics of "a single filter" are the impedance-frequency characteristics of the filter FT1 in the case where a coil of another filter does not exist around the coil CL1 of the filter FT1. Hereinafter, these characteristics are referred to as "impedance-frequency characteristics of the single filter FT1.

Figure 11A:
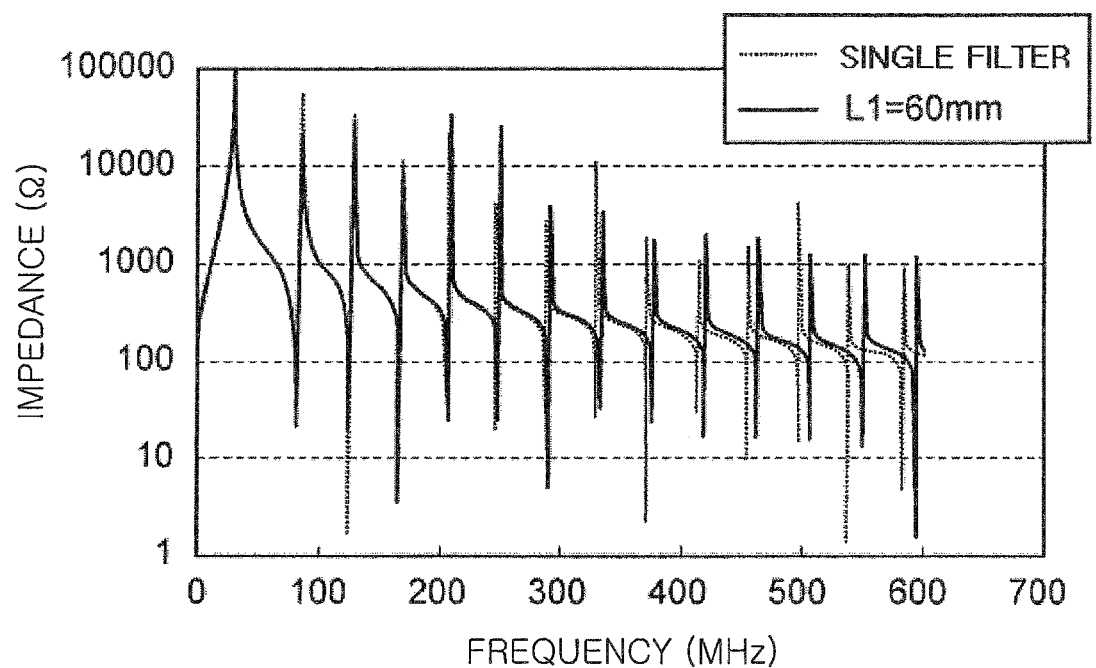
FIGS. 11A and 11B show results of second simulation.
Figure 11B:
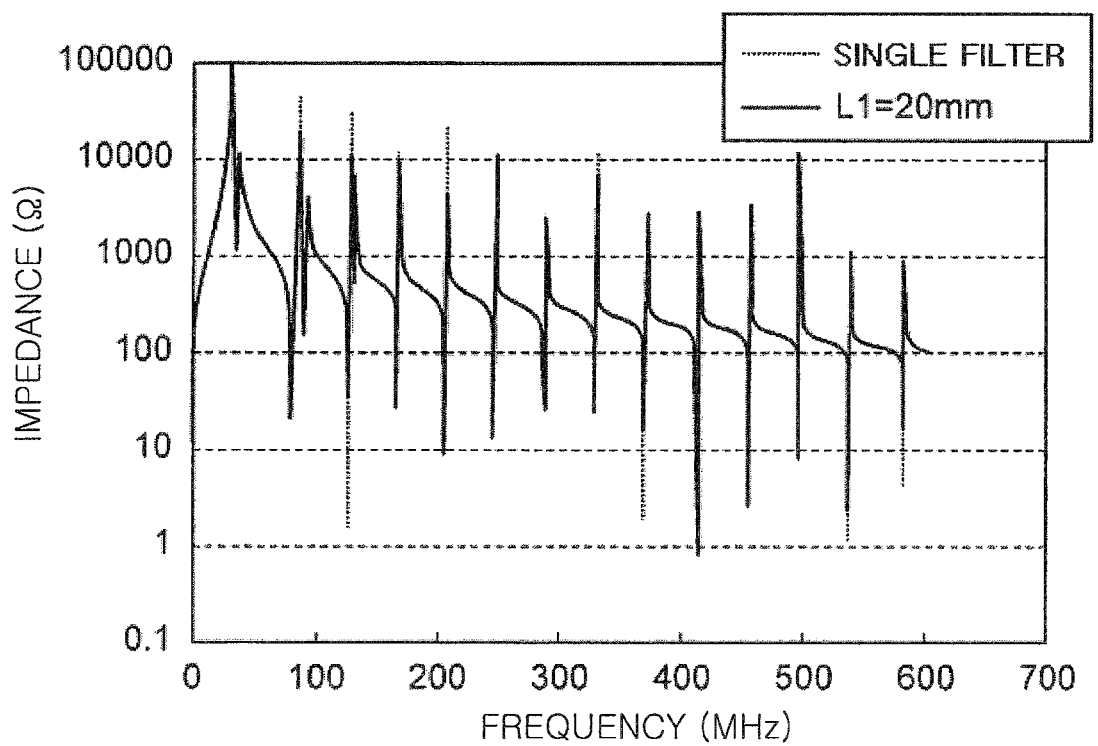
Figure 12A:
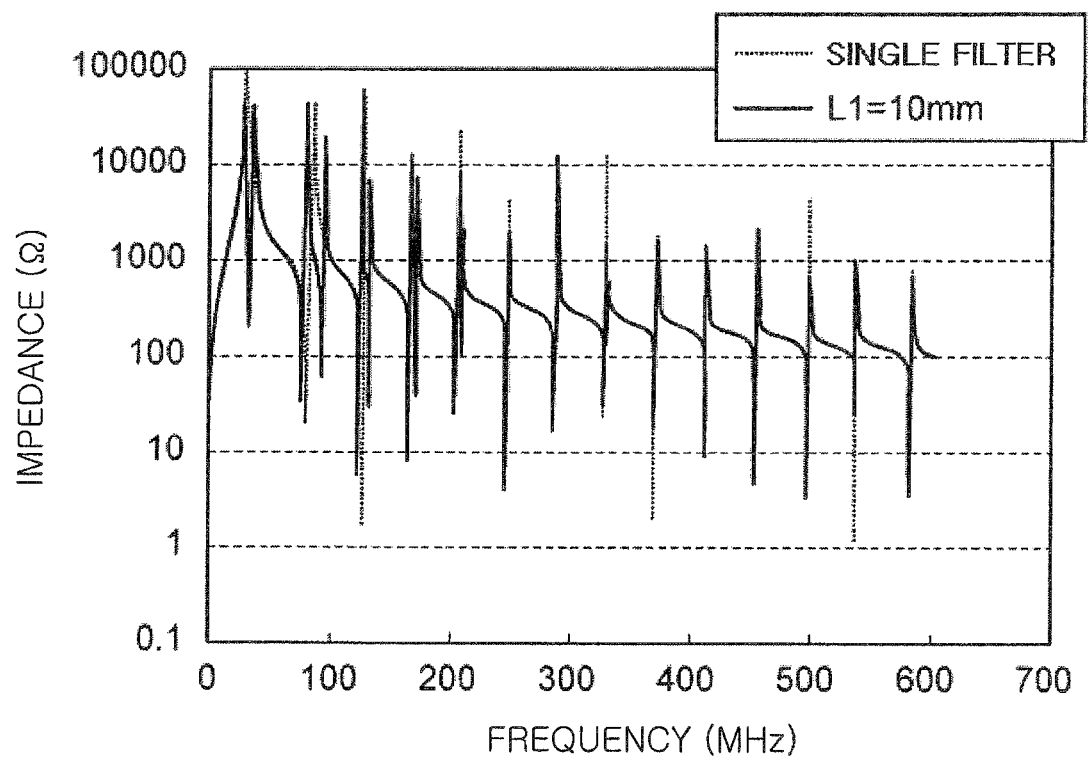
FIGS. 12A and 12B show results of the second simulation.
Figure 12B:
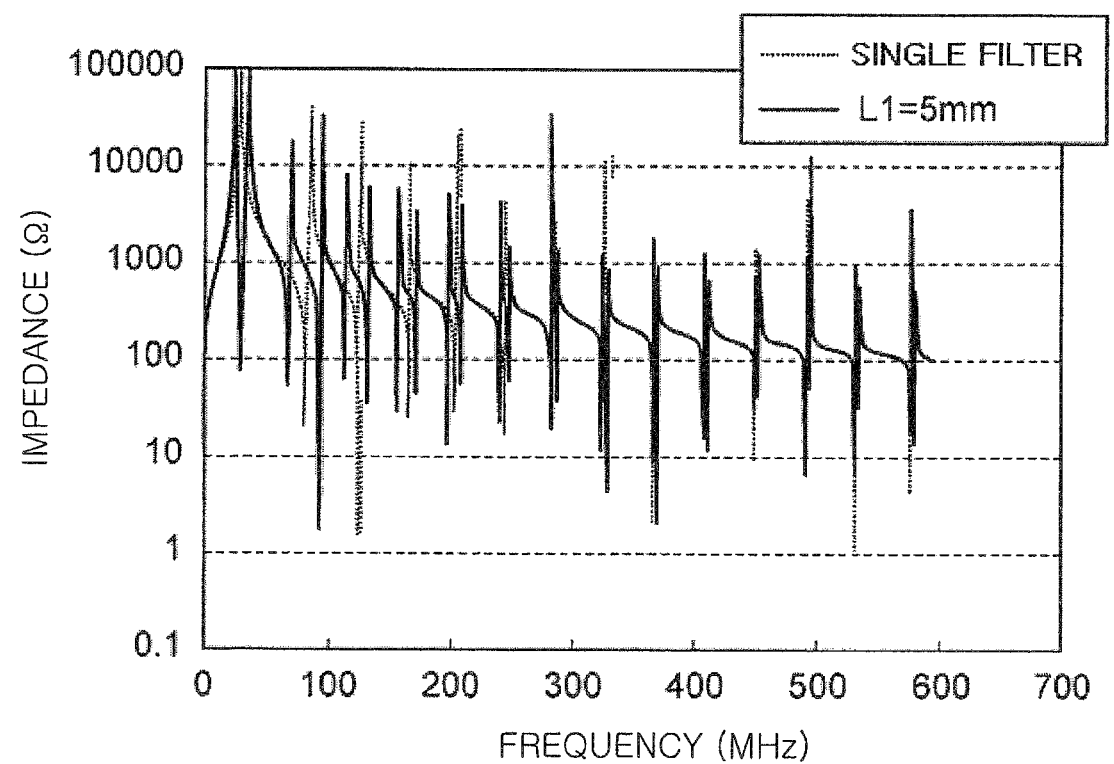

As shown in FIG. 11A, when the first distance L1 is 60 mm (three times greater than the inner diameter r of the coil CL1), the impedance-frequency characteristics of the filter FT1 are different from the impedance-frequency characteristics of the single filter FT1 in the high frequency bandwidth of 300 MHz or above. From this, it is clear that the first distance L1 is preferably smaller than the distance three times greater than the inner diameter r of the coil CL1. As shown in FIG. 11B, when the first distance L1 is 20 mm (equal to the inner diameter r of the coil CL1), the impedance-frequency characteristics of the filter FT1 are substantially the same as the impedance-frequency characteristics of the single filter FT1 in a wide frequency band of 0 MHz to 600 MHz. As shown in FIG. 12A, when the first distance L1 is 10 mm (½ of the inner diameter r of the coil CL1), the impedance-frequency characteristics of the filter FT1 are different from the impedance-frequency characteristics of the single filter FT1 in a low frequency band. As shown in FIG. 12B, when the first distance L1 is 5 mm (¼ of the inner diameter r of the coil CL1), the impedance-frequency characteristics of the filter FT1 are different from the impedance-frequency characteristics of the single filter FT1 in a wide frequency band. From this, it is clear that the first distance L1 is preferably greater than ½ of the inner diameter r of the coil CL1.

Figure 13:
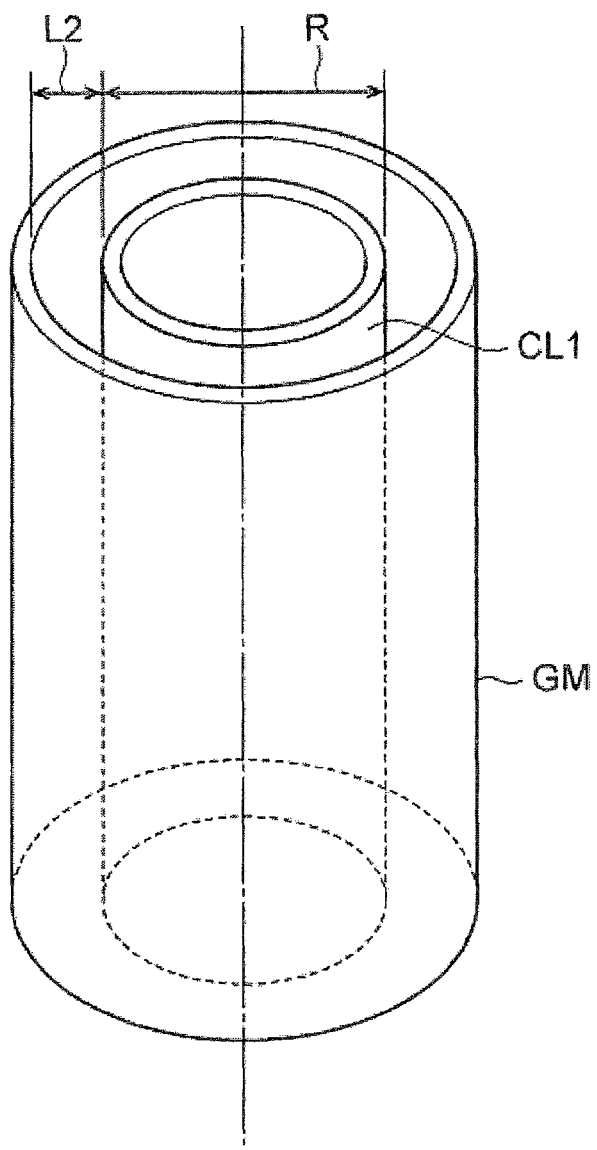
FIG. 13 is a perspective view showing a ground member and a coil in third simulation.

Hereinafter, a result of third simulation on the second distance L2 will be described. In the third simulation, the impedance-frequency characteristics of the filter including the coil CL1 and the capacitor CP1 were obtained while using the second distance L2 between the coil CL1 and the ground member as a variable parameter. FIG. 13 is a perspective view showing the coil and the ground member in the third simulation. As shown in FIG. 13, a ground member GM used in the third simulation has a cylindrical shape and is disposed coaxially at the outer side of the coil CL1. In the third simulation, the second distance was set to 16.4 mm, 13 mm, 8.2 mm and 32.8 mm. "13 mm" is substantially the same as a safety distance, i.e., 12.7 mm, for preventing discharge between the coil CL1 and the ground member. In the third simulation, the following setting was used.

Figure 14A:
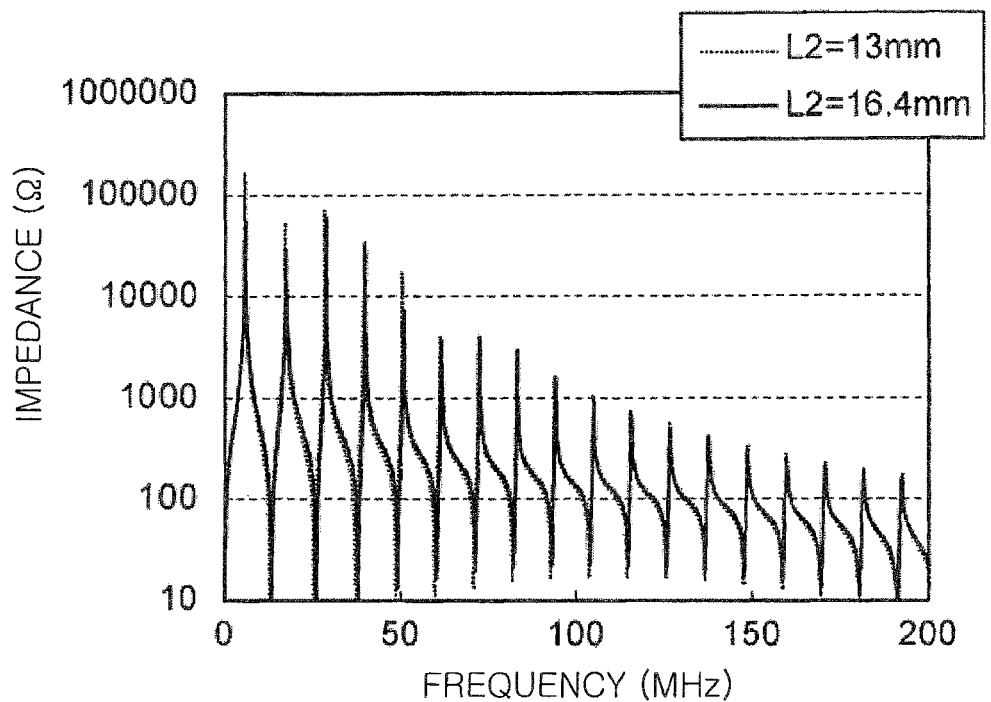
FIGS. 14A, 14B, and 15 show results of the third simulation.
Figure 14B:
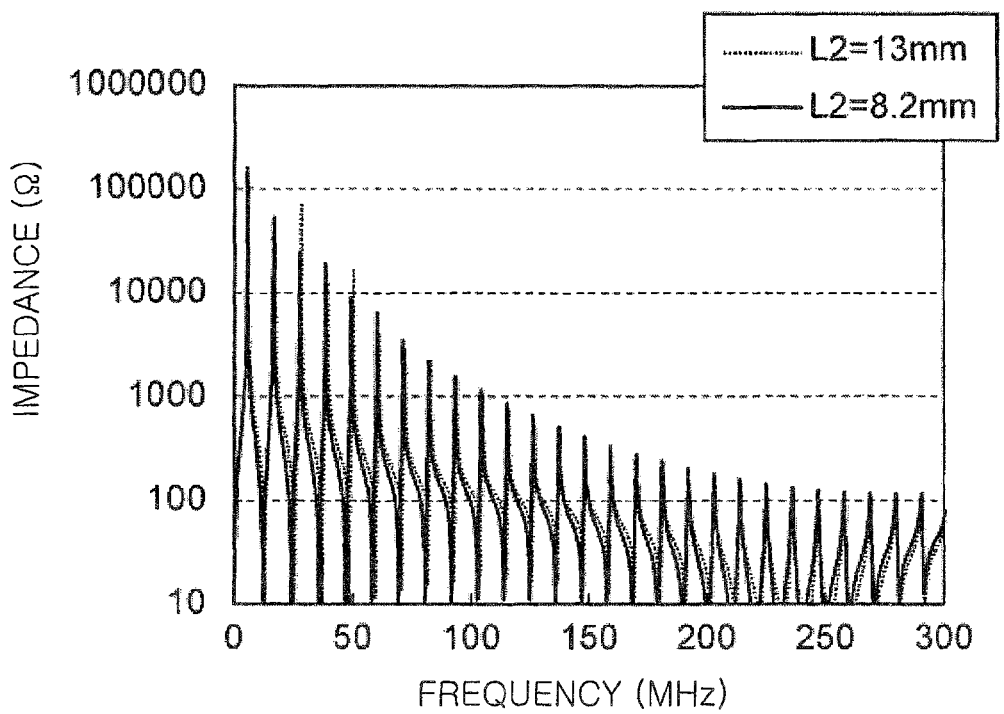
Figure 15:
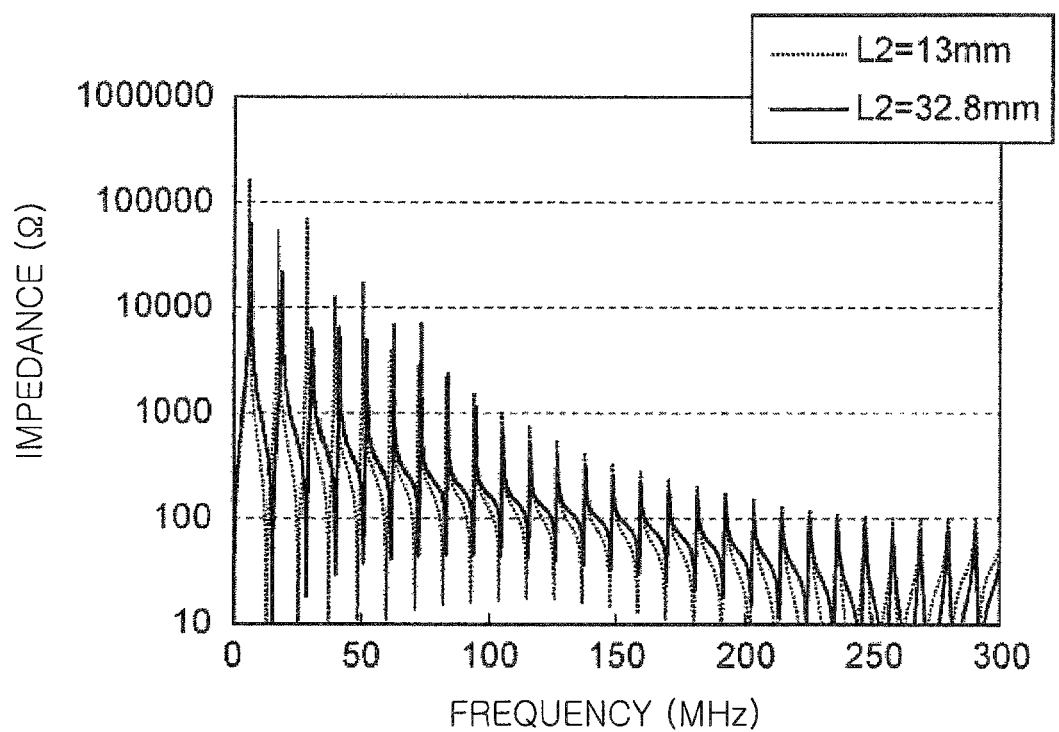

<Setting of Third Simulation>
Inner diameter r of the coil CL1: 82 mm
Outer diameter R of the coil CL1: 94 mm
Shape of windings of the coil CL1: straight angle shape of 6.0 mm×1.6 mm The number of turns of the coil CL1: 48 turns Length of the coil CL1: 288 mm Electrostatic capacitance of the capacitor CP1: 2700 pF FIGS. 14A and 14B and FIG. 15 show the result of the third simulation. The horizontal axis and the vertical axis in the graph shown in FIGS. 14A, 14B and 15 represent the frequency and the impedance, respectively. As shown in FIG. 14A, the impedance-frequency characteristics of the filter in the case of setting the second distance L2 to 16.4 mm substantially coincide with the impedance-frequency characteristics of the filter in the case of setting the second distance L2 to 13 mm. As shown in FIG. 14B, the impedance-frequency characteristics of the filter in the case of setting the second distance L2 to 8.2 mm are different from the impedance-frequency characteristics of the filter in the case of setting the second distance L2 to mm. As shown in FIG. 15, the impedance-frequency characteristics of the filter in the case of setting the second distance L2 to 32.8 mm are different from the impedance-frequency characteristics of the filter in the case of setting the second distance L2 to 13 mm. Therefore, in the case of using the filter in which the second distance L2 is set to be greater than or equal to 12.7 mm and smaller than or equal to 16.4 mm, it is possible to prevent the discharge between the coil CL1 and the ground member GM and also possible to obtain the impedance-frequency characteristics that are substantially the same as those of the filter in which the second distance L2 is substantially the same as the safety distance.

Hereinafter, other layouts of a plurality of coils CL1 and a plurality of ground members GM will be described. The layouts to be described below satisfy the above-described three conditions. The layouts to be described below may also be applied to the relation between a plurality of coils CL2 and a plurality of ground members GM.

Figure 16:
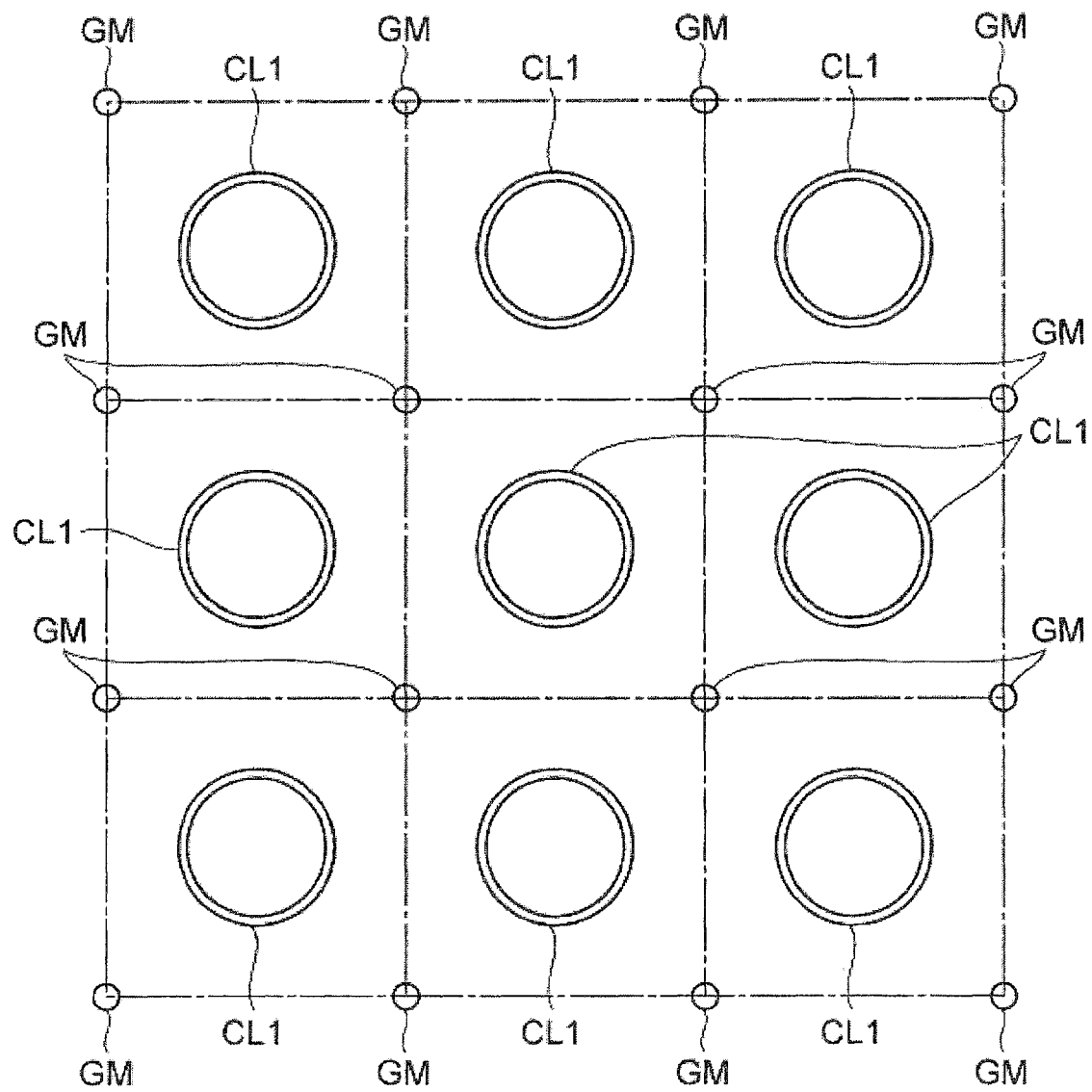
FIGS. 16 to 23 show other examples of the layout of the coils and the ground members.

In a layout shown in FIG. 16, on a cross section perpendicular to the central axis CX, the centers of 3×3 coils CL1 coincide with the centers of nine squares consecutively arranged along one direction and a direction perpendicular thereto. Further, on the cross section perpendicular to the central axis CX, positions of corners of the nine squares coincide with positions of 4×4 ground members GM. In the layout shown in FIG. 16, some of four ground members GM closest to each coil CL1 are shared by another coil CL1 as a part of ground members closest thereto. In the layout shown in FIG. 16, a unit structure including the coil CL1 and the four ground members GM closest thereto is arranged along one direction and a direction perpendicular thereto such that translational symmetry is satisfied.

Figure 17:
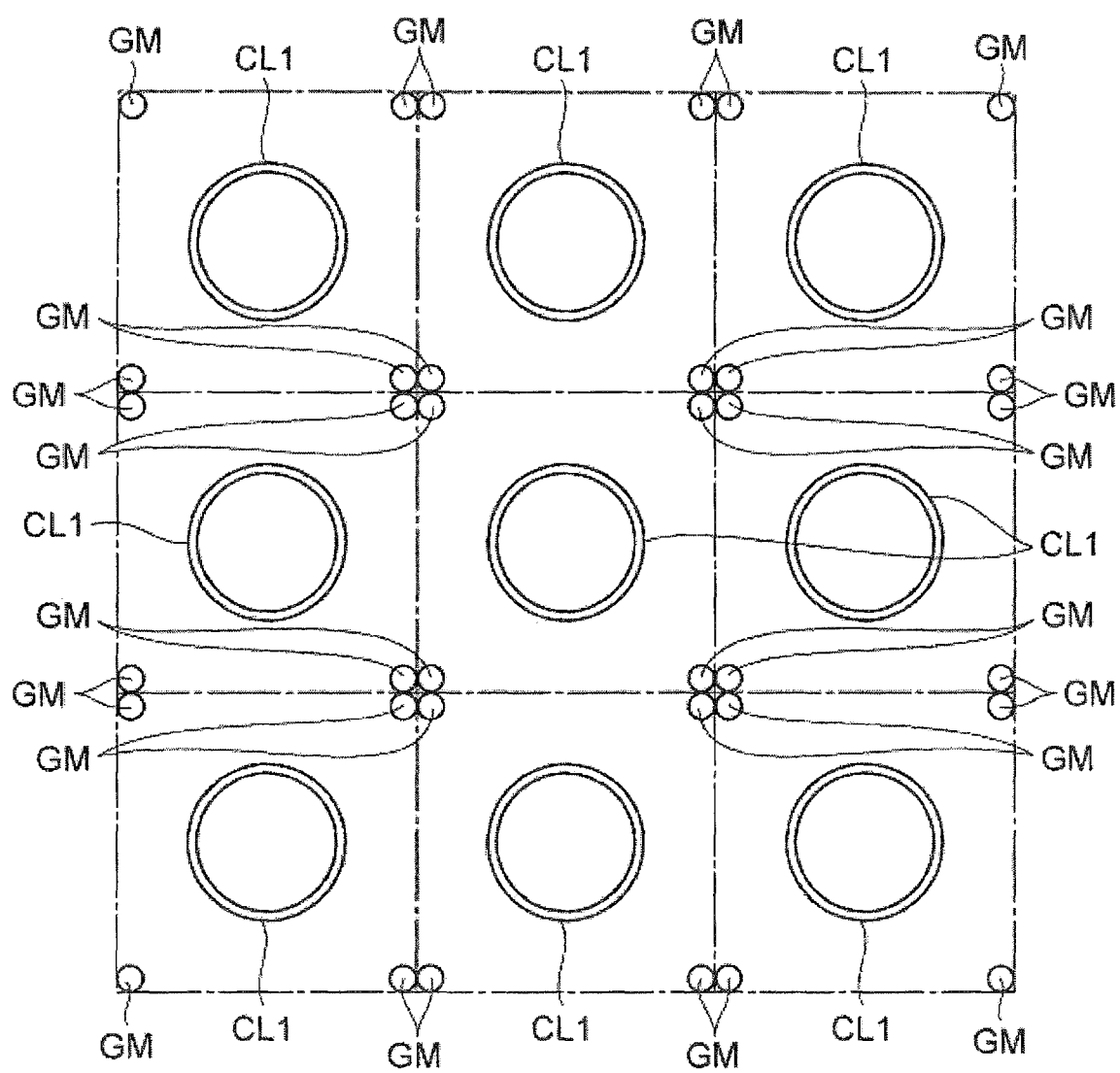

In a layout shown in FIG. 17, on a cross section perpendicular to the central axis CX, the centers of 3×3 coils CL1 coincide with the centers of nine squares consecutively arranged along one direction and a direction perpendicular thereto. Further, on the cross section perpendicular to the central axis CX, four ground members GM are respectively located at four corners of each of the nine squares. In the layout shown in FIG. 17, four ground members GM closest to each coil CL1 are not shared by another coil CL1 as a part of ground members closest thereto. In the layout shown in FIG. 17, a unit structure including the coil CL1 and the four ground members GM closest thereto is arranged along one direction and a direction perpendicular thereto such that translational symmetry is satisfied.

Figure 18:
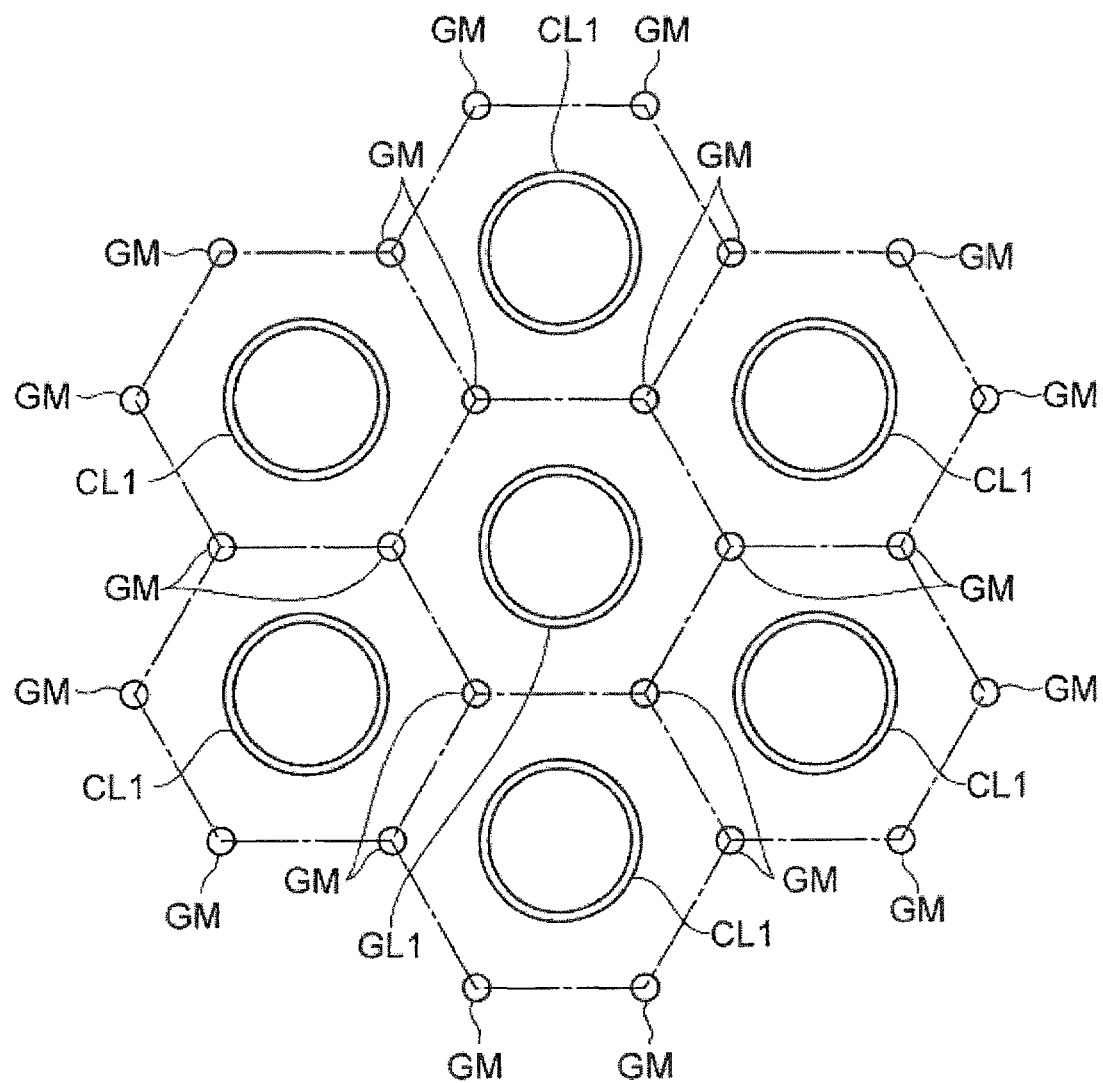

In a layout shown in FIG. 18, on a cross section perpendicular to the central axis CX, the centers of seven coils CL1 coincide with the centers of seven regular hexagons arranged close to each other. Further, on the cross section perpendicular to the central axis CX, positions of the ground members GM coincide with vertices of the seven regular hexagons. In the layout shown in FIG. 18, some of six ground members GM closest to each coil CL1 are shared by another coil CL1 as a part of the ground members closest thereto. In the layout shown in FIG. 18, a unit structure including the coil CL1 and the six ground members GM closest thereto is arranged such that translational symmetry and rotational symmetry are satisfied.

Figure 19:
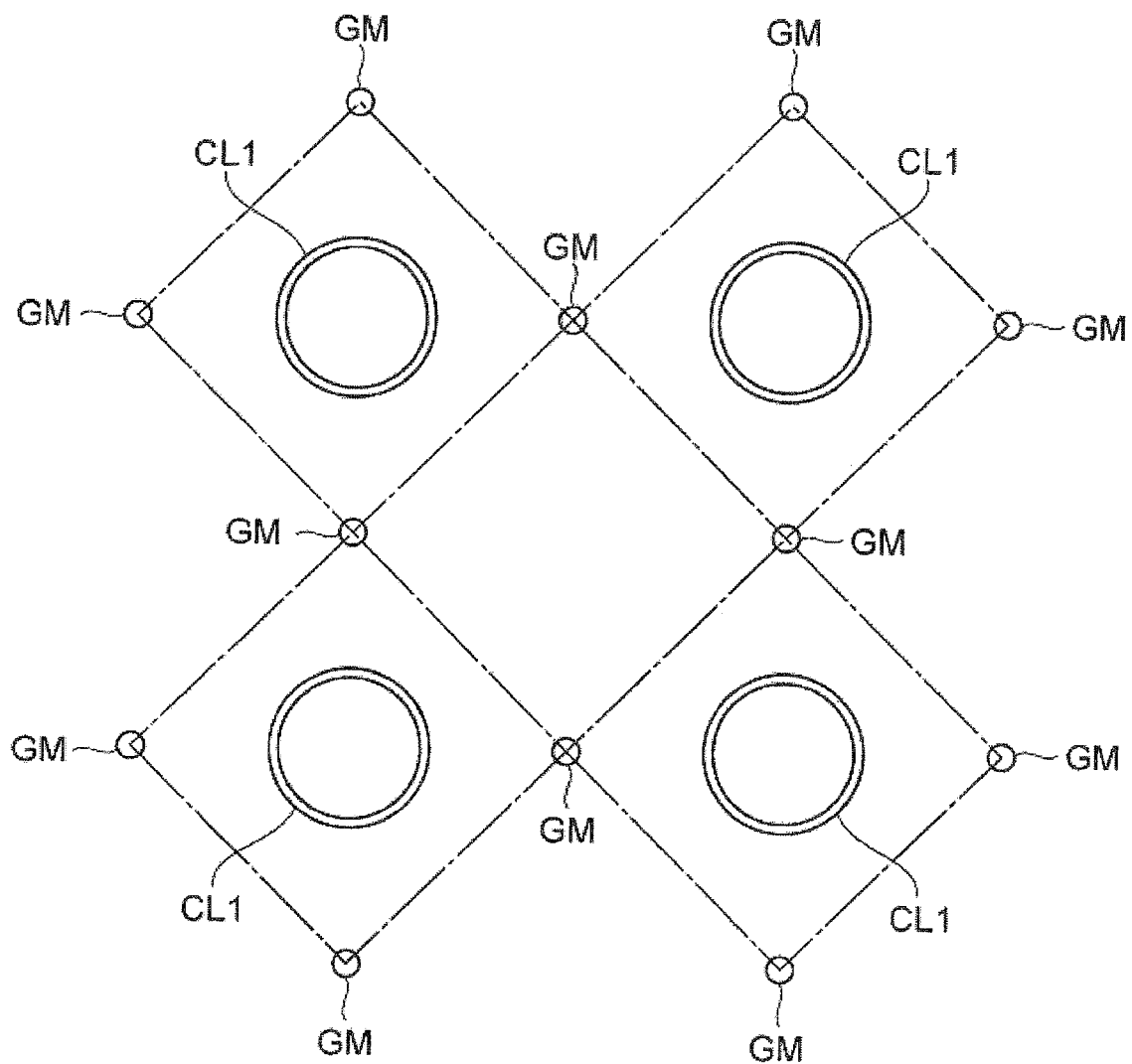

In a layout shown in FIG. 19, on a cross section perpendicular to the central axis CX, the centers of four coils CL1 coincide with the centers of four squares except the central square among five squares arranged in a cross shape. Further, on the cross section perpendicular to the central axis CX, positions of ground members GM coincide with the corners of the four squares. In the layout shown in FIG. 19, one of four ground members GM closest to each coil CL1 is shared by another coil CL1 as one of the ground members closest thereto. In the layout shown in FIG. 19, a unit structure including the coil CL1 and the four ground members GM closest thereto is arranged such that translational symmetry and rotational symmetry are satisfied.

Figure 20:
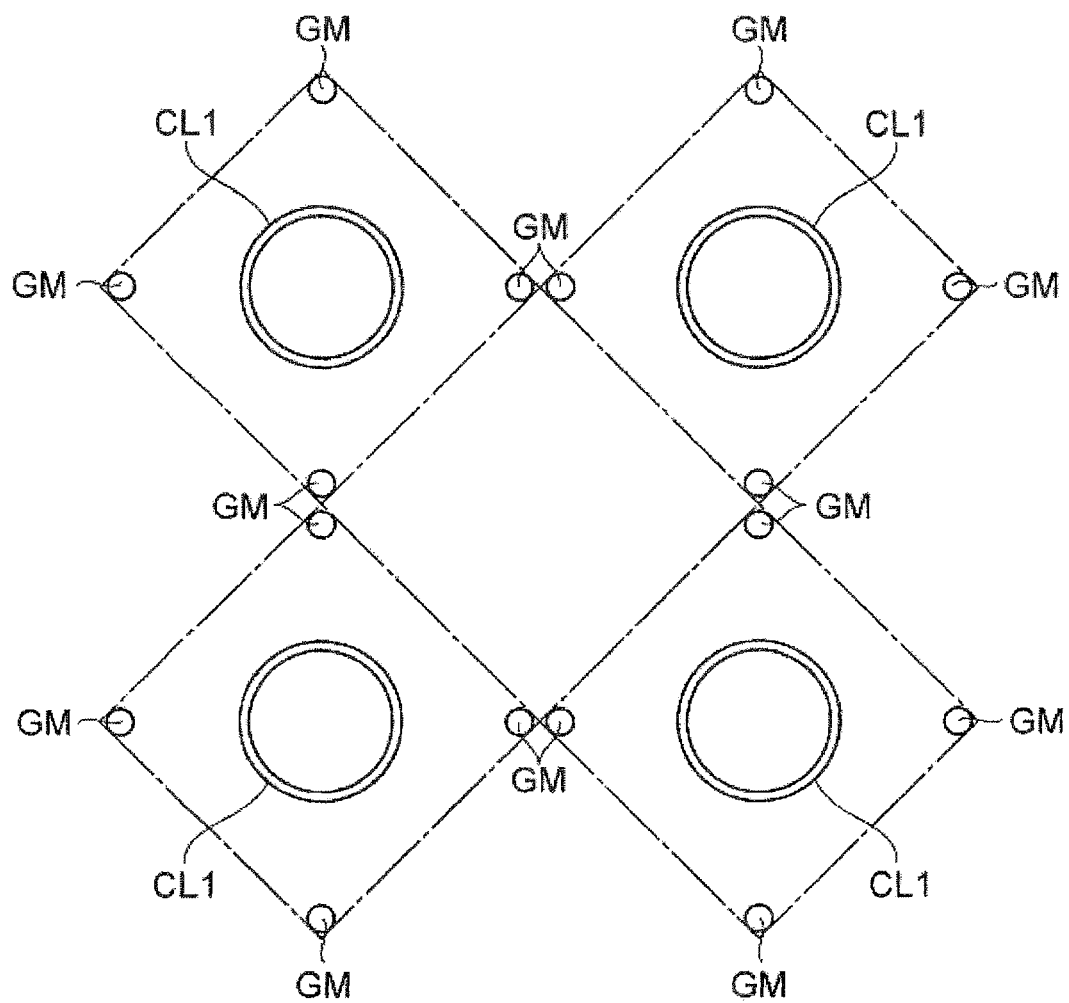

In a layout shown in FIG. 20, on a cross section perpendicular to the central axis CX, the centers of four coil CL1 coincide with the centers of four squares except the central square among five squares arranged in a cross shape. Further, on the cross section perpendicular to the central axis CX, ground members GM are arranged at the corners of the four squares. In the layout shown in FIG. 20, four ground members GM closest to each coil CL1 are not shared by another coil CL1 as ground members closest thereto. In the layout shown in FIG. 20, a unit structure including the coil CL1 and the four ground members GM closest thereto is arranged such that translational symmetry and rotational symmetry are satisfied.

Figure 21:
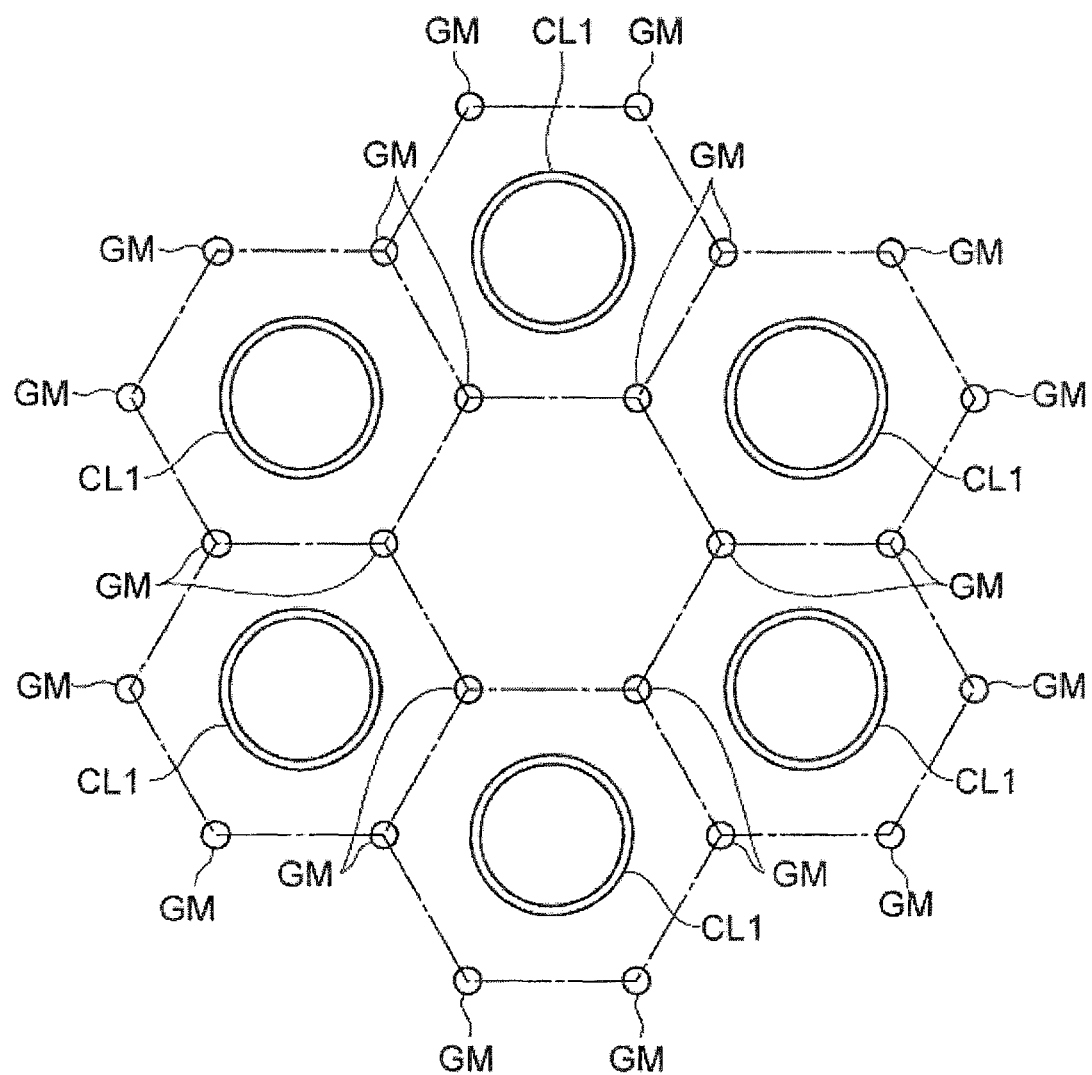

In a layout shown in FIG. 21, on a cross section perpendicular to the central axis CX, the centers of six coils CL1 coincide with the centers of six regular hexagons except the central regular hexagon among seven regular hexagons arranged close to one another. Further, on the cross section perpendicular to the central axis CX, positions of ground members GM coincide with vertices of the six regular hexagons. In the layout shown in FIG. 21, some of the six ground members GM closest to each coil CL1 are shared by another coil CL1 as a part of the ground members closest thereto. In the layout shown in FIG. 21, a unit structure including the coil CL1 and the six ground members GM closest thereto is arranged such that rotational symmetry is satisfied.

Figure 22:
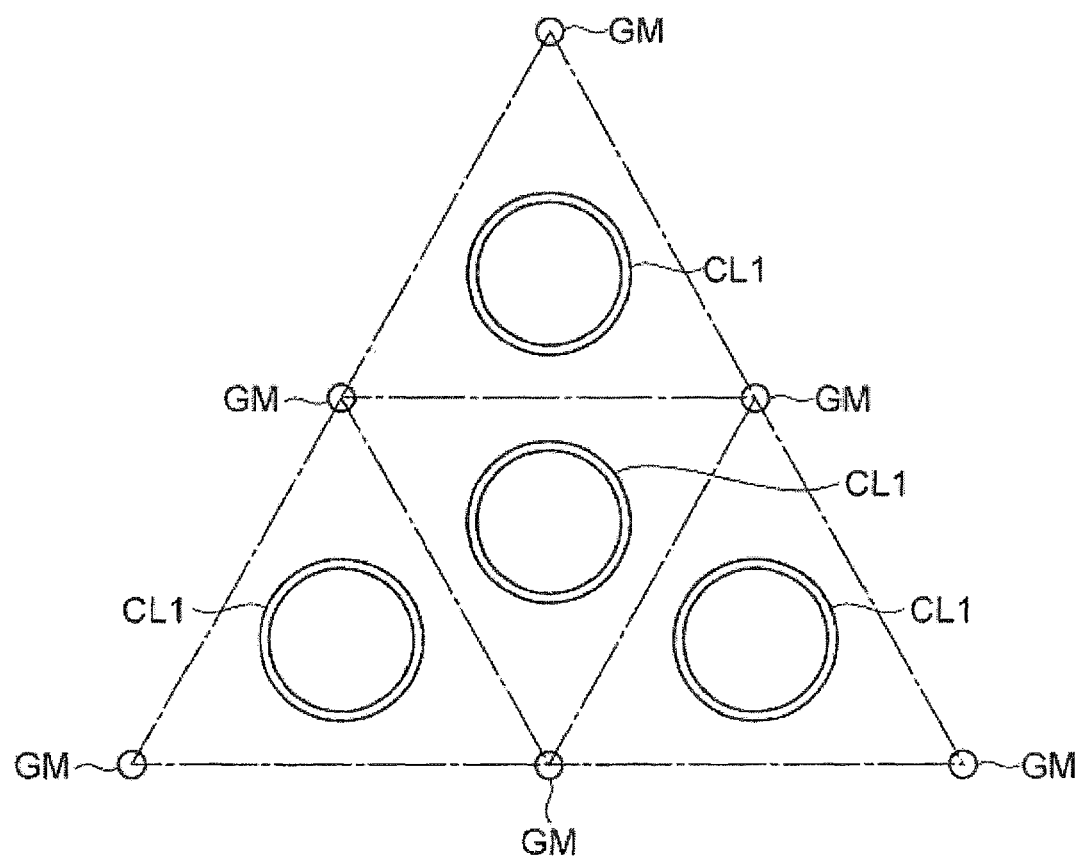

In a layout shown in FIG. 22, on a cross section perpendicular to the central axis CX, the centers of four coils CL1 coincide with the centers of four regular triangles obtained by uniformly dividing one regular triangle. Further, on the cross section perpendicular to the central axis CX, positions of ground members GM coincide with vertices of the four regular triangles. In the layout shown in FIG. 22, some of three ground members GM closest to each coil CL1 are shared by another coil CL1 as a part of the ground members closest thereto. In the layout shown in FIG. 22, a unit structure including the coil CL1 and the six ground members GM closest thereto is arranged such that rotational symmetry is satisfied.

Figure 23:
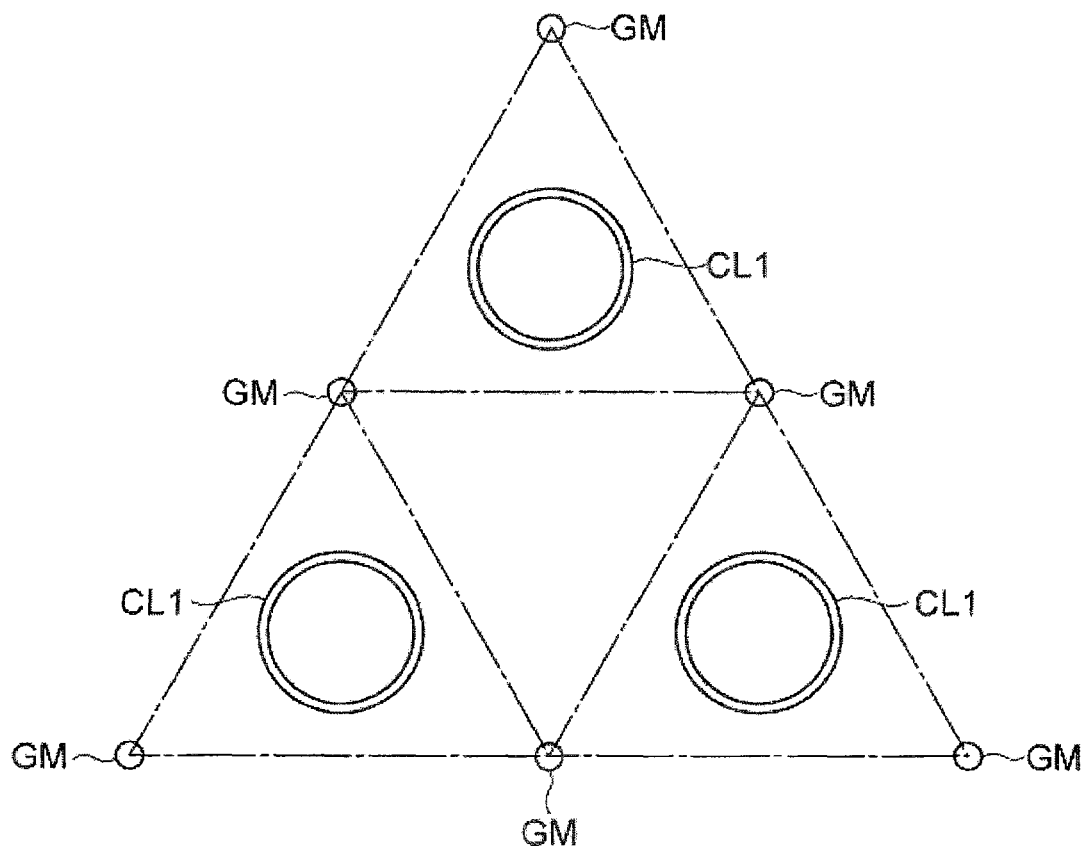

In a layout shown in FIG. 23, on a cross section perpendicular to the central axis CX, the centers of three coils CL1 coincide with the centers of three regular triangles except the central regular triangle among four regular triangles obtained by uniformly dividing one regular triangle. Further, on the cross section perpendicular to the central axis CX, positions of ground members GM coincide with vertices of the three regular triangles. In the layout shown in FIG. 23, some of three ground members GM closest to each coil CL1 are shared by another coil CL1 as a part of the ground members closest thereto. In the layout shown in FIG. 23, a unit structure including the coil CL1 and the three ground members GM closest thereto is arranged such that rotational symmetry is satisfied.

As can be seen from the above description, the layout of the ground members GM and the coils CL1 of the filter device FA needs to satisfy at least one of the translational symmetry and the rotational symmetry. The layout of the ground members GM and the coils CL2 of the filter device FA also needs to satisfy at least one of the translational symmetry and the rotational symmetry. In addition, a plurality of filter groups, each of which includes a plurality of filters including a plurality of coils CL1 and a plurality of ground members GM arranged in the layouts shown in FIGS. 16 to 23, may be arranged along the extension direction of the central axes CX of the coils CL1. A plurality of filter groups, each of which includes a plurality of filters including a plurality of coils CL2 and a plurality of ground members GM, may also be arranged along the extension direction of the central axes CX of the coils CL2.

While various embodiments have been described, the present disclosure is not limited to the above embodiments and may be variously modified. The filter device that satisfies the three conditions of the layout is not limited to the use in a plasma processing apparatus using a microwave and may also be used in another plasma processing apparatus such as a capacitively coupled plasma processing apparatus, an inductively coupled plasma processing apparatus or the like. Further, the filter device may be used in an apparatus other than the plasma processing apparatus which needs to block or attenuate a high frequency.

While the disclosure has been shown and described with respect to the embodiments, it will be understood by those skilled in the art that various changes and modifications may be made without departing from the scope of the disclosure as defined in the following claims.

What is claimed is:

1. A filter device comprising:
a plurality of coils each having a central axis, wherein the central axes are spatially offset from one another and in parallel to one another; and a plurality of ground members each connected to at least one ground region of the filter device, wherein the plurality of ground members are spaced apart from one another and extend in parallel to the central axes of the coils at positions outside of the coils,
wherein each of the coils is spaced apart from another coil closest thereto by a first distance,
each of the ground members is spaced apart from a coil closest thereto by a second distance, and
the number of ground members spaced apart from each of the plurality of coils by the second distance is the same.

2. The filter device of claim 1, wherein the first distance is greater than ½ of an inner diameter of each of the plurality of coils and smaller than a distance three times greater than the inner diameter.

3. The filter device of claim 1, wherein the second distance is greater than or equal to 12.7 mm and smaller than or equal to 16.4 mm.

4. The filter device of claim 2, wherein the second distance is greater than or equal to 12.7 mm and smaller than or equal to 16.4 mm.

5. The filter device of claim 1, further comprising:
one or more first printed circuit boards provided at one ends of the respective coils; and
one or more second printed circuit boards provided at the other ends of the respective coils,
wherein the respective coils are supported by said one or more first printed circuit boards and said one or more second printed circuit boards.

6. The filter device of claim 5, wherein the respective ground members constitute columns configured to support said one or more first printed circuit boards and said one or more second printed circuit boards.

7. A filter device of claim 5, further comprising:
a plurality of capacitors connected to the respective coils,
wherein said one or more first printed circuit boards support the capacitors,
the at least one ground region is provided at said one or more first printed circuit boards, and
and the at least one ground region is connected to the capacitors.

8. A filter device of claim 6, further comprising:
a plurality of capacitors connected to the respective coils,
wherein said one or more first printed circuit boards support the capacitors,
the at least one ground region is provided at said one or more first printed circuit boards, and
the at least one ground region is connected to the capacitors.

9. A plasma processing apparatus comprising:
a chamber main body;
a mounting table provided in the chamber main body, the mounting table including a lower electrode, an electrostatic chuck and a plurality of heaters;
a high frequency power supply connected to the lower electrode;
the filter device described in claim 1; and
a heater controller including a power supply electrically connected to the heaters,
wherein the coils of the filter device are connected between the heaters and the power supply to form power feed lines therebetween, respectively.

* * * * *